(12) United States Patent
Chen

(10) Patent No.: US 11,233,361 B2
(45) Date of Patent: Jan. 25, 2022

(54) ELECTRICAL CONNECTOR ASSEMBLY WITH HEAT SINK MOUNTED ON A SHIELDING CAGE

(71) Applicant: Molex, LLC, Lisle, IL (US)

(72) Inventor: Chien-Chih Chen, New Taipei (TW)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/924,211

(22) Filed: Jul. 9, 2020

(65) Prior Publication Data

US 2021/0013679 A1 Jan. 14, 2021

(30) Foreign Application Priority Data

Jul. 12, 2019 (CN) .......................... 201910630324.6

(51) Int. Cl.
*H01R 13/6581* (2011.01)
*H01R 13/6594* (2011.01)
(Continued)

(52) U.S. Cl.
CPC ..... *H01R 13/6581* (2013.01); *H01R 13/6594* (2013.01); *H05K 7/2039* (2013.01); *H05K 7/20409* (2013.01); *H05K 7/20418* (2013.01); *G02B 6/4266* (2013.01); *G02B 6/4277* (2013.01); *H01L 23/34* (2013.01); *H01L 23/40* (2013.01); *H01L 23/552* (2013.01); *H01L 2023/405* (2013.01); *H01L 2225/06589* (2013.01); *H01L 2225/1094* (2013.01);
(Continued)

(58) Field of Classification Search
CPC ........ H01L 23/34; G02B 6/4266–4277; H01R 13/6581; H01R 13/6594; H01R 13/502; H01R 13/6586; H01R 13/6588; H01R 13/20; H05K 7/20418; H05K 7/20409; H05K 7/2039; H05K 9/0058
USPC ........................................ 439/196, 485, 487
See application file for complete search history.

(56) References Cited

U.S. PATENT DOCUMENTS 6,986,679 B1 1/2006 Aranson et al.
9,160,090 B2 10/2015 Su et al.
(Continued)

FOREIGN PATENT DOCUMENTS

CN 101930100 A 12/2010
CN 203386957 U 1/2014
(Continued)

*Primary Examiner* — Abdullah A Riyami
*Assistant Examiner* — Justin M Kratt

(57) ABSTRACT

A connector assembly is provided which includes a shielding shell, a receptacle connector and a heat sink. The shielding shell has a top wall, a receiving cavity positioned inside, an inserting opening which is positioned at a front end of the shielding shell and communicated with the receiving cavity and a window which is formed to the top wall, extends rearwardly and is communicated with the receiving cavity. The receptacle connector is provided to a rear segment of the receiving cavity. The heat sink is provided to the top wall and includes a heat dissipating base. A bottom face of the heat dissipating base downwardly enters the receiving cavity via the window and directly faces a top face of the receptacle connector. The bottom face of the heat dissipating base facing the receptacle connector is provided with a front stopping portion which is adapted to stop a mating module.

18 Claims, 20 Drawing Sheets

(51) Int. Cl.
  *H05K 7/20*      (2006.01)
  *G02B 6/42*      (2006.01)
  *H05K 9/00*      (2006.01)
  *H01R 13/6586*   (2011.01)
  *H01L 23/34*     (2006.01)
  *H01L 23/40*     (2006.01)
  *H01R 13/502*    (2006.01)
  *H01R 13/6588*   (2011.01)
  *H01L 23/552*    (2006.01)
  *H01R 13/20*     (2006.01)

(52) U.S. Cl.
  CPC ...... *H01L 2924/3025* (2013.01); *H01R 13/20* (2013.01); *H01R 13/502* (2013.01); *H01R 13/6586* (2013.01); *H01R 13/6588* (2013.01); *H05K 9/0058* (2013.01)

(56) References Cited

U.S. PATENT DOCUMENTS

2014/0196943 A1    7/2014  Hirschy
2017/0214170 A1*   7/2017  Su .................... G02B 6/4269

FOREIGN PATENT DOCUMENTS

| CN | 205846322 U | 12/2016 |
| TW | 201828800 A | 8/2018 |
| TW | M574818 U | 2/2019 |

\* cited by examiner

ELECTRICAL CONNECTOR ASSEMBLY WITH HEAT SINK MOUNTED ON A SHIELDING CAGE

RELATED APPLICATIONS

This application claims priority to Chinese Application No. 201910630324.6 filed on Jul. 12, 2019, which is incorporated herein by reference in its entirety.

TECHNICAL FIELD

The present disclosure relates to a connector assembly, and particularly relates to a connector assembly having a heat sink.

BACKGROUND

Chinese invention patent application publication No. CN101930100A (corresponding to U.S. Pat. No. 7,794,241) discloses a connector, a guide frame of the connector includes a metal body which is formed by stamping and defines a shell having a top wall, a bottom wall and side walls. A receptacle connector is mounted in a rear segment of a cavity of the guide frame. The top wall of the guide frame has a large opening overlaying the cavity, the cavity accommodates a heat sink. The heat sink includes an engagement surface mounted into the cavity, the engagement surface of the heat sink physically contacts and abuts against an inserted mating module. The top wall of the guide frame includes a front portion, a rear portion and opposed lateral portions which define a perimeter of the opening. The portions of the top wall also define a seat of the heat sink. When the heat sink is mounted over the opening, the top wall supports the heat sink. The rear portion of the top wall includes a front stop in the form of a tab extending downwardly, the tab slightly protrudes inwardly into the opening and downwardly into the cavity. The front stop fixedly configured in the top wall engages a rear surface of the mating module to prevent the mating module from rearwardly passing through the guide frame beyond a specified distance. However, because the rear portion of the top wall is still present above the receptacle connector, the heat sink is positioned on a top face of the rear portion of the top wall, that is to say, the heat sink and the receptacle connector are still spaced apart by the rear portion of the top wall, which will affects heat dissipating efficiency. And because of presence of the rear portion of the top wall, although the engagement surface of the heat sink enters into the cavity via the opening, a bottom face of the heat sink at the rear portion of the top wall must be raised to above the top face of the rear portion of the top wall, which results in that the bottom face of the heat sink must have a height difference with respect to a part thereof extending rearwardly, particularly in a heat sink including a heat pipe, the heat pipe also is correspondingly bent.

SUMMARY

Therefore, an object of the present disclosure is to provide a connector assembly which can improve at least one problem in prior art.

Accordingly, in some embodiments, a connector assembly of the present disclosure comprises a shielding shell, a receptacle connector and a heat sink. The shielding shell has a top wall, a receiving cavity positioned inside, an inserting opening which is positioned at a front end of the shielding shell and communicated with the receiving cavity and a window which is formed to the top wall, extends rearwardly and is communicated with the receiving cavity. The receptacle connector is provided to a rear segment of the receiving cavity, the window of the shielding shell extends rearwardly to expose a top face of the receptacle connector. The heat sink is provided to the top wall, the heat sink comprises a heat dissipating base, a bottom face of the heat dissipating base downwardly enters into the receiving cavity via the window and directly faces the top face of the receptacle connector, a position of the bottom face of the heat dissipating base facing the receptacle connector is provided with a front stopping portion which protrudes downwardly and is adapted to stop a mating module.

In some embodiments, the shielding shell further has a rear wall positioned at a rear end of the shielding shell, a position of the bottom face of the heat dissipating base facing the rear wall is provided with a rear stopping portion which protrudes downwardly, the rear stopping portion is limited by the rear wall in a direction toward the rear.

In some embodiments, the shielding shell of window extends rearwardly and passes through the rear wall to form a notch at an upper edge of the rear wall, the bottom face of the heat dissipating base straightly extends rearwardly and extends out from the notch of the rear wall by a distance.

In some embodiments, the heat dissipating base comprises a base plate, the base plate has a bottom plate portion which is recessed downwardly and enters into the window, the bottom face of the heat dissipating base is positioned to a bottom face of the bottom plate portion of the base plate.

In some embodiments, the base plate further has a front wing portion and two side wing portions, the front wing portion and the two side wing portions are connected to the bottom plate portion and provided to a top face of the top wall.

In some embodiments, each side wing portion of the base plate of the heat sink is formed with a slit, the connector assembly further comprises a clip used to mount the heat sink to the shielding shell, the clip has a pressing plate which presses against the heat sink and two latching plates which extend downwardly from two sides of the pressing plate respectively, the two latching plates pass through the slits of the two side wing portions respectively to latch with the shielding shell.

In some embodiments, the bottom face of the bottom plate portion is provided with protruding bars which extend in a front-rear direction and protrude downwardly, front ends of the protruding bars together constitutes the front stopping portion, rear ends of the protruding bars together constitutes the rear stopping portion.

In some embodiments, the bottom face of the bottom plate portion is provided with a plurality of protruding bars which each extend laterally and protrude downwardly, a part of the plurality of protruding bars positioned in the front constitutes the front stopping portion, a part of the plurality of protruding bars positioned in the rear constitutes the rear stopping portion.

In some embodiments, the bottom face of the bottom plate portion is provided with a protruding block which protrudes downwardly, a front side of the protruding block constitutes the front stopping portion, a rear side of the protruding block constitutes the rear stopping portion.

Accordingly, in some embodiments, a connector assembly of the present disclosure comprises a shielding shell, a receptacle connector and a heat sink. The shielding shell has a top wall, a receiving cavity positioned inside, an inserting opening which is positioned at a front end of the shielding shell and communicated with the receiving cavity and a window which is formed to the top wall and is communicated with the receiving cavity, the window extends rearwardly and passes through a rear end of the shielding shell. The receptacle connector is provided to a rear segment of the receiving cavity. The heat sink is provided to the top wall, the heat sink comprises a heat dissipating base, the heat dissipating base comprises a heat pipe, a bottom face of the heat dissipating base downwardly enters into the receiving cavity via the window and directly faces a top face of the receptacle connector, the bottom face of the heat dissipating base and the heat pipe straightly extend rearwardly out from the rear end of from the shielding shell by a distance.

In some embodiments, the heat dissipating base further comprises a base plate, the base plate has a bottom plate portion which is recessed downwardly and enters into the window, the bottom face of the heat dissipating base is positioned to a bottom face of the bottom plate portion of the base plate, and the heat pipe is provided to a top face of the bottom plate portion, the bottom plate portion and the heat pipe straightly extend rearwardly out from the rear end of the shielding shell by a distance, and the heat sink further comprises a heat dissipating fin provided to the base plate of the heat dissipating base.

In some embodiments, a position of the bottom face of the bottom plate portion facing the receptacle connector is provided with a front stopping portion which protrudes downwardly and is adapted to stop a mating module.

In some embodiments, the shielding shell further has a rear wall positioned at a rear end of the shielding shell, the window of the shielding shell extends rearwardly and passed through the rear wall to form a notch at an upper edge of the rear wall, the bottom plate portion straightly extends rearwardly and extend out from the notch of the rear wall by a distance, a position of the bottom face of the bottom plate portion facing the rear wall is provided with a rear stopping portion which protrudes downwardly, the rear stopping portion is limited by the rear wall in a direction toward the rear.

In some embodiments, the base plate further has a front wing portion and two side wing portions, the front wing portion and the two side wing portions are connected to the bottom plate portion and provided to a top face of the top wall.

In some embodiments, each side wing portion of the base plate of the heat sink is formed with a slit, the connector assembly further comprises a clip used to mount the heat sink to the shielding shell, the clip has a pressing plate which presses against the heat sink and two latching plates which extend downwardly from two sides of the pressing plate respectively, the two latching plates pass through the slits of the two side wing portions respectively to latch with the shielding shell.

In some embodiments, the bottom face of the bottom plate portion is provided with protruding bars which extend in a front-rear direction and protrude downwardly, front ends of the protruding bars together constitutes the front stopping portion, rear ends of the protruding bars together constitutes the rear stopping portion.

In some embodiments, the bottom face of the bottom plate portion is provided with a plurality of protruding bars which each extend laterally and protrude downwardly, a part of the plurality of protruding bars positioned in the front constitutes the front stopping portion, a part of the plurality of protruding bars positioned in the rear constitutes the rear stopping portion.

In some embodiments, the bottom face of the bottom plate portion is provided with a protruding block which protrudes downwardly, a front side of the protruding block constitutes the front stopping portion, a rear side of the protruding block constitutes the rear stopping portion.

The present disclosure may have some of the following effects: by that the window of the shielding shell extends rearwardly to expose the top face of the receptacle connector, the heat sink can directly face the receptacle connector at a lower position without any spacer via the window, and the bottom face of the heat sink or the heat pipe can straightly extend rearwardly, thereby improving heat dissipating efficiency. And by that the front stopping portion used to stop the mating module and the rear stopping portion used to be limited in position by the rear wall in a direction toward the rear are provided to the bottom face of the heat dissipating base, the heat sink further enters into the receiving cavity by means of the front stopping portion and the rear stopping portion, and the heat sink can be closer to the receptacle connector, so as to further strengthen heat dissipating efficiency. And the front stopping portion can move upwardly with the heat sink, which can optimize the whole configuration and has more limiting function in position.

BRIEF DESCRIPTION OF THE DRAWINGS

Other features and technical effects of the present disclosure will be apparent in embodiments referring to the accompanying figures, in which.

DETAILED DESCRIPTION OF THE PREFERRED EMBODIMENTS

Figure 1:
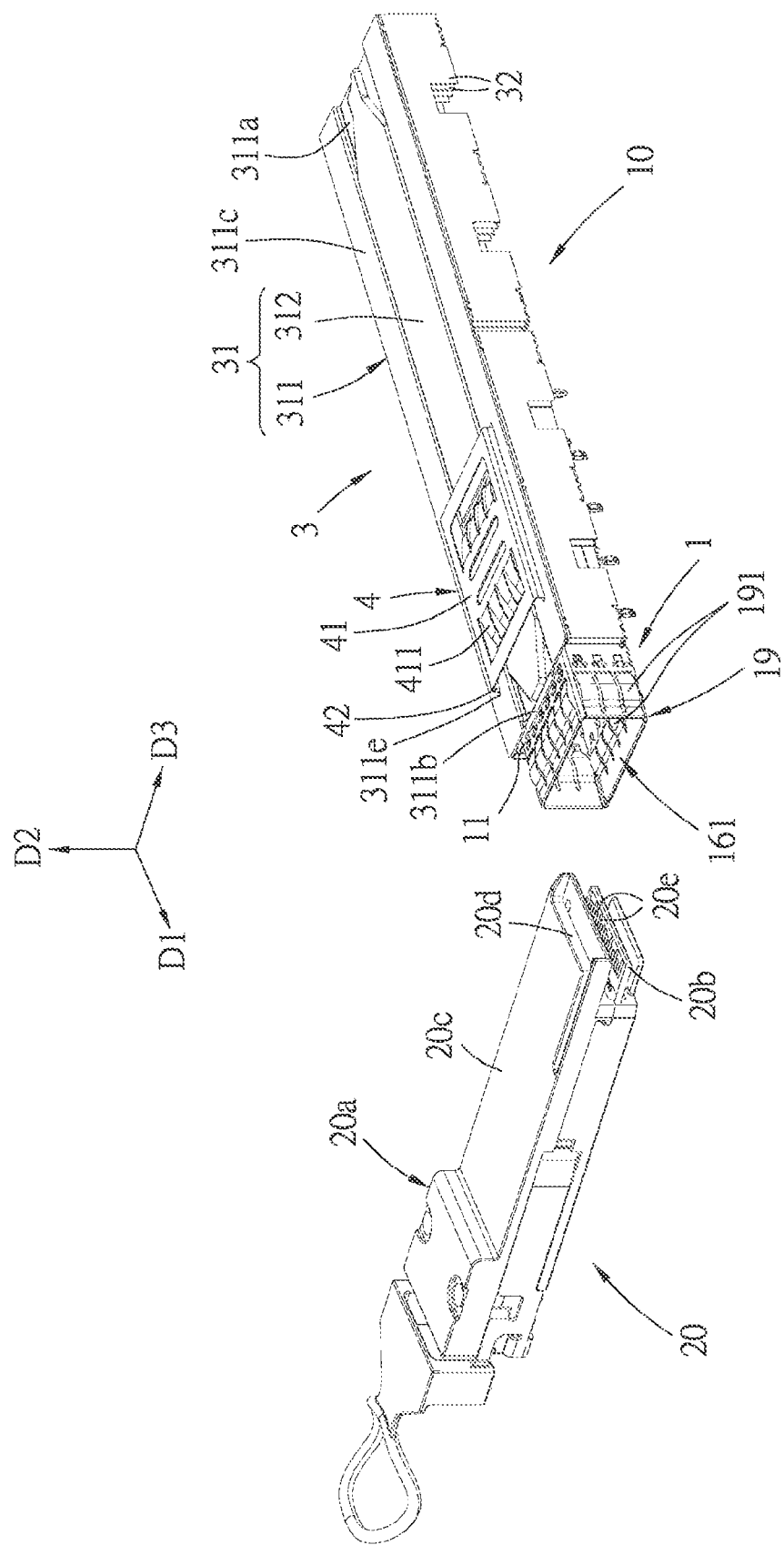
FIG. 1 is a perspective view of a first embodiment of a connector assembly of the present disclosure and a mating module.

Before the present disclosure is described in detail, it should be noted that like elements are denoted by the same reference numerals in the following description.

Referring to FIG. 1 to FIG. 5, a first embodiment of a connector assembly 10 of the present disclosure is adapted to mate with a mating module 20, the connector assembly 10 includes a shielding shell 1, a receptacle connector 2, a heat sink 3 and a clip 4.

The shielding shell 1, for example, may be metal material, the shielding shell 1 extends along a front-rear direction D1 and has a top wall 11, a bottom wall 12 which is spaced apart from and faces the top wall 11 along an up-down direction D2, two side walls 13 which are spaced apart from and faces each other along a left-right direction D3 and respectively connected to two sides of the top wall 11 and the bottom wall 12, a rear wall 14 which is positioned at a rear end of the shielding shell 1 and connected to rear edges of the top wall 11 and the two side walls 13 and a plurality of insertion legs 15 which extends downwardly from the two side walls 13 and the rear wall 14 and are adapted to be fixed on a circuit board (not shown) and/or connected to a grounding trace. The bottom wall 12 is formed with a plurality of bulges 121 bulging downwardly in the first embodiment. And the shielding shell 1 further has a receiving cavity 16 which is defined by the top wall 11, the bottom wall 12, the two side walls 13 and the rear wall 14 together and positioned inside, an inserting opening 161 which is positioned at a front end of the shielding shell 1, communicated with the receiving cavity 16 and allows the mating module 20 to insert, a window 17 which is formed to the top wall 11, extends rearwardly along the front-rear direction D1 and is communicated with the receiving cavity 16, and a bottom opening 18 which is positioned behind the bottom wall 12 and communicated with the receiving cavity 16. Moreover, a grounding member 19 is provided at the inserting opening 161 of the shielding shell 1, the grounding member 19 has a plurality of elastic fingers 191 which extend rearwardly from a position of the inserting opening 161 and are distributed at an outer side of the shielding shell 1 and an inner side of the shielding shell 1, the elastic finger of the plurality of elastic fingers 191 positioned at the outer side of the shielding shell 1 is used to contact a case (not shown), the elastic finger of the plurality of elastic finger 191 positioned at the inner side of the shielding shell 1 is used to contact the mating module 20.

Referring to FIG. 2 to FIG. 6, the receptacle connector 2 is provided to a rear segment of the receiving cavity 16, and the receptacle connector 2 has a housing 21 and a plurality of terminals 22, the housing 21 has a mating slot 211 facing the inserting opening 161, each terminal 22 has a contact portion 221 positioned in the mating slot 211 and a tail portion 222 electrically and mechanically connected to the circuit board. Specifically, the receptacle connector 2 is provided to the circuit board, and the receptacle connector 2 is provided to the receiving cavity 16 via the bottom opening 18 so that receptacle connector 2 is covered by the shielding shell 1, but the present disclosure is not limited thereto. The window 17 of the shielding shell 1 extends rearwardly to expose a top face of the receptacle connector 2 and passes through the rear wall 14 at the rear end of the shielding shell 1 to form a notch 141 at an upper edge of the rear wall 14.

Referring to FIG. 2, FIG. 4, FIG. 5, FIG. 7 and FIG. 8, the heat sink 3 is provided to the top wall 11 of the shielding shell 1, the heat sink 3 includes a heat dissipating base 31 provided to the top wall 11 and a plurality of heat dissipating fins 32 provided to the heat dissipating base 31. A bottom face of the heat dissipating base 31 enters downwardly into the receiving cavity 16 via the window 17 and directly faces the top face of the receptacle connector 2, the heat dissipating base 31 and the bottom face thereof straightly extend rearwardly and extends out from the notch 141 of the rear wall 14 positioned at the rear end of the shielding shell 1 by a distance. In the first embodiment, the heat dissipating base 31 includes a base plate 311 which is for example metal in material and a heat pipe 312 which has a flat shape. The base plate 311 has a bottom plate portion 311a which is recessed downwardly, enters into the window 17, straightly extends rearwardly and extend out from the notch 141 of the rear wall 14 by a distance, a front wing portion 311b which is connected to a front edge of the bottom plate portion 311a and provided to a top face of the top wall 11, and two side wing portions 311c which are connected to two side edges of the bottom plate portion 311a respectively, provided to the top face of the top wall 11, and each extend out from the top wall 11a along the left-right direction D3 by a distance, and the bottom face of the heat dissipating base 31 is positioned to a bottom face of the bottom plate portion 311a of the base plate 311. A flat shape pipe body of the heat pipe 312 is made of a metal material (for example copper) having high thermal conductive efficiency, which has a closed cavity inside filled with an actuating fluid (for example pure water), by that the actuating fluid performs continuous circulating of liquid-vapor two-phase variation in the closed cavity, the heat pipe 312 exhibits characteristic of rapid uniform temperature to attain a function of rapidly conducting heat. The heat pipe 312 is provided on a top face of the bottom plate portion 311a downwardly recessed, and the bottom plate portion 311a and the heat pipe 312 straightly extend rearwardly out from the rear end of the shielding shell 1 by a distance, the heat pipe 312 may be provided to the bottom plate portion 311a by for example welding, but the present disclosure is not limited thereto. By that the window 17 of the shielding shell 1 extends rearwardly to expose the top face of the receptacle connector 2, the heat sink 3 can directly faces the receptacle connector 2 at a lower position without any spacer via the window 17, and the bottom face of the heat sink 3 and the heat pipe 312 can straightly extend rearwardly, thereby improving heat dissipating efficiency. And, in the first embodiment, a guiding portion 311d is further connected between the bottom plate portion 311a and the front wing portion 311b, the guiding portion 311d obliquely extends forwardly and upwardly from the bottom plate portion 311a toward the front wing portion 311b and is used to guide insertion of the mating module 20.

The plurality of heat dissipating fins 32 each generally have a plate shape, the plurality of heat dissipating fins 32 are arranged parallel to each other along front-rear direction D1 and connected by latching, the plurality of heat dissipating fins 32 are positioned at outer sides of the two side walls 13 of the shielding shell 1 and a rear side of the rear wall 14 of the shielding shell 1, and the plurality of heat dissipating fins 32 are provided to bottom faces of the bottom plate portion 311a and the two side wing portions 311c of the base plate 311. The plurality of heat dissipating fins 32 are provided to the heat dissipating base 31 by for example welding, but in other embodiments, the plurality of heat dissipating fin 32 may be a configuration which does not employ the latching means and integrally formed with the base plate 311 of the heat dissipating base 31, but the present disclosure is not limited thereto. The plurality of heat dissipating fins 32 may strengthen heat dissipating efficacy of the heat sink 3.

Referring to FIG. 1, FIG. 5 and FIG. 8 to FIG. 10, the mating module 20 has a casing 20a and a mating circuit board 20b. The casing 20a has a mating portion 20c which is used to insert into the receiving cavity 16 via the inserting opening 161 of the shielding shell 1, the mating circuit board 20b is provided to the casing 20a, protrudes from the mating portion 20c of the casing 20a and is used to insert into the mating slot 211 of the receptacle connector 2 so as to make conductive contact portions 20e on the mating circuit board 20b and the contact portions 221 of the plurality of terminals 22 in the mating slot 211 electrically connected, a front end of the mating portion 20c of the casing 20a is formed with a positioning end face 20d positioned above the mating circuit board 20b. A front stopping portion 313 is provided to a position of the bottom face of the bottom plate portion 311a of the heat dissipating base 31 facing the receptacle connector 2, protrudes downwardly and is adapted to stop the positioning end face 20d of the mating module 20 and prevent the mating module 20 from excessively inserting during mating. When the mating portion 20c is inserted into the inserting opening 161, the front end of the mating module 20 contacts the guiding portion 311d of the base plate 311, as the insertion of the mating module 20 continues, the heat sink 3 is raised and the top face of the mating module 20 contacts the bottom face of the heat dissipating base 31, and the front stopping portion 313 moves upwardly with the heat sink 3, in comparison with the front stop which is a fixed form configured in the top wall in the background, a position of the positioning end face 20d in the mating module 20 may be more offset upwardly and may more close to the top face of the mating portion 20c, even a width of the positioning end face 20d in the up-down direction D2 may be made smaller. And a rear stopping portion 314 is provided at a position of the bottom face of the bottom plate portion 311a of the heat dissipating base 31 facing the rear wall 14 and protrudes downwardly, the rear stopping portion 314 is limited in position by the rear wall 14 in a direction toward the rear, in turn the heat sink 3 is limited in position and is prevent from moving rearwardly. Specifically, in the first embodiment, the bottom face of the bottom plate portion 311a is provided with two protruding bars 315 which each extend in the front-rear direction D1 and which are arranged side by side with each other and protrude downwardly, front ends of the two protruding bars 315 together constitutes the front stopping portion 313, rear ends of the two protruding bars 315 together constitutes the rear stopping portion 314. For example, as in the first embodiment, the two protruding bars 315 may be formed by downwardly stamping a plate metal so as to make portions of the plate metal protrude, the two protruding bars 315 also may be welded to the bottom face of the bottom plate portion 311a by welding means. By that the front stopping portion 313 used to stop the mating module 20 and the rear stopping portion 314 used to be limited in position by the rear wall 14 in a direction toward the rear are provided to the bottom face of the heat dissipating base 31, the heat sink 3 further enters into the receiving cavity 16 by means of the front stopping portion 313 and the rear stopping portion 314, and the heat sink 3 can be closer to the receptacle connector 2, so as to further strengthen heat dissipating efficiency.

It is noted that, in other varied embodiments, the heat dissipating base 31 also may only has one of the base plate 311 and the heat pipe 312, the present disclosure is not limited to the first embodiment. In an embodiment that the heat dissipating base 31 only has the heat pipe 312 or in an embodiment that a position of the heat pipe 312 is lower than the base plate 311, the bottom face of the heat dissipating base 31 is positioned to the bottom face of the heat pipe 312, the bottom face of the heat pipe 312 downwardly enters into the receiving cavity 16 and directly faces the top face of the receptacle connector 2, and the front stopping portion 313 and the rear stopping portion 314 are provided to the bottom face of the heat pipe 312.

Figure 2:
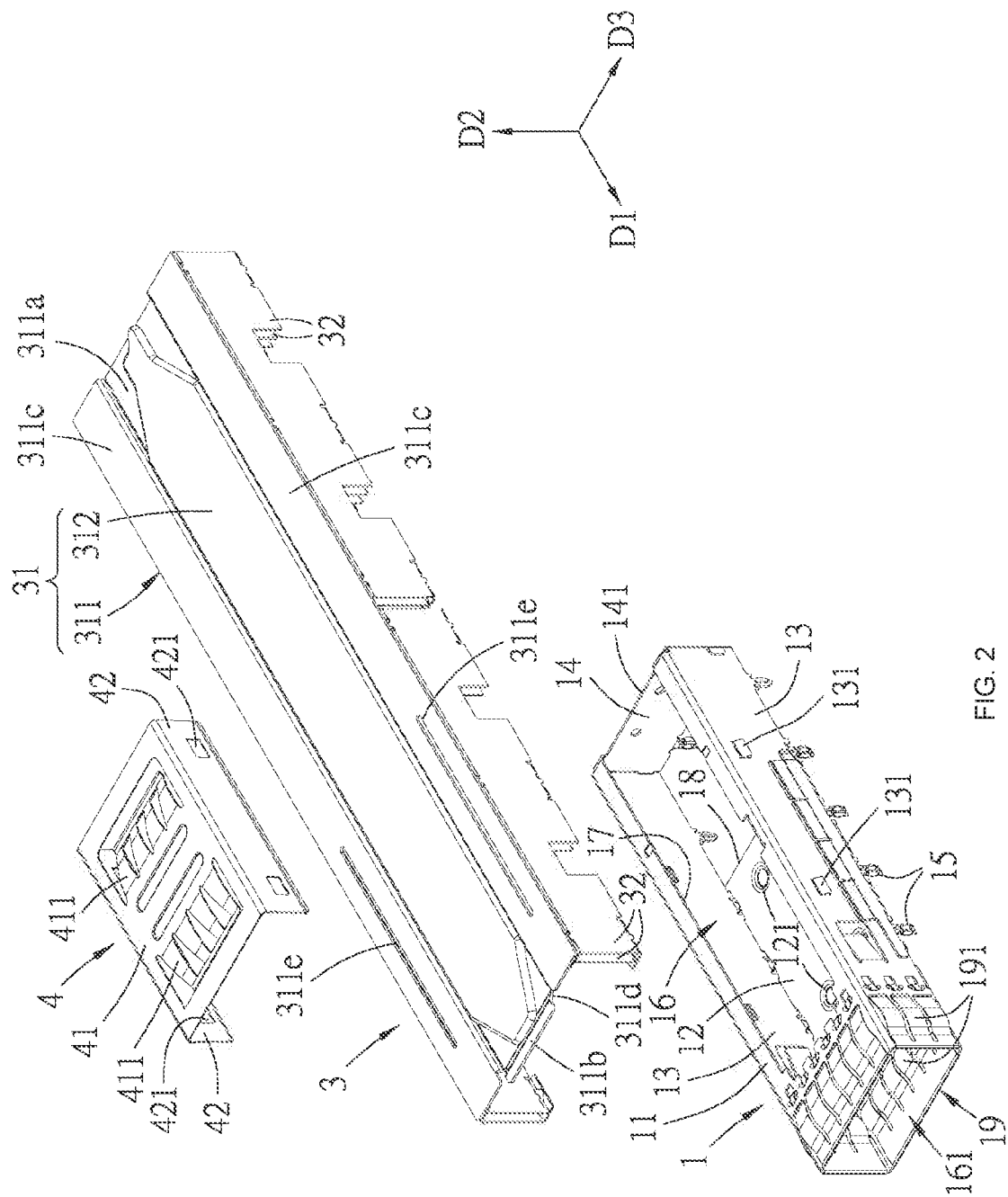
FIG. 2 is an exploded perspective view of the first embodiment, in which a receptacle connector of the first embodiment is omitted.
Figure 3:
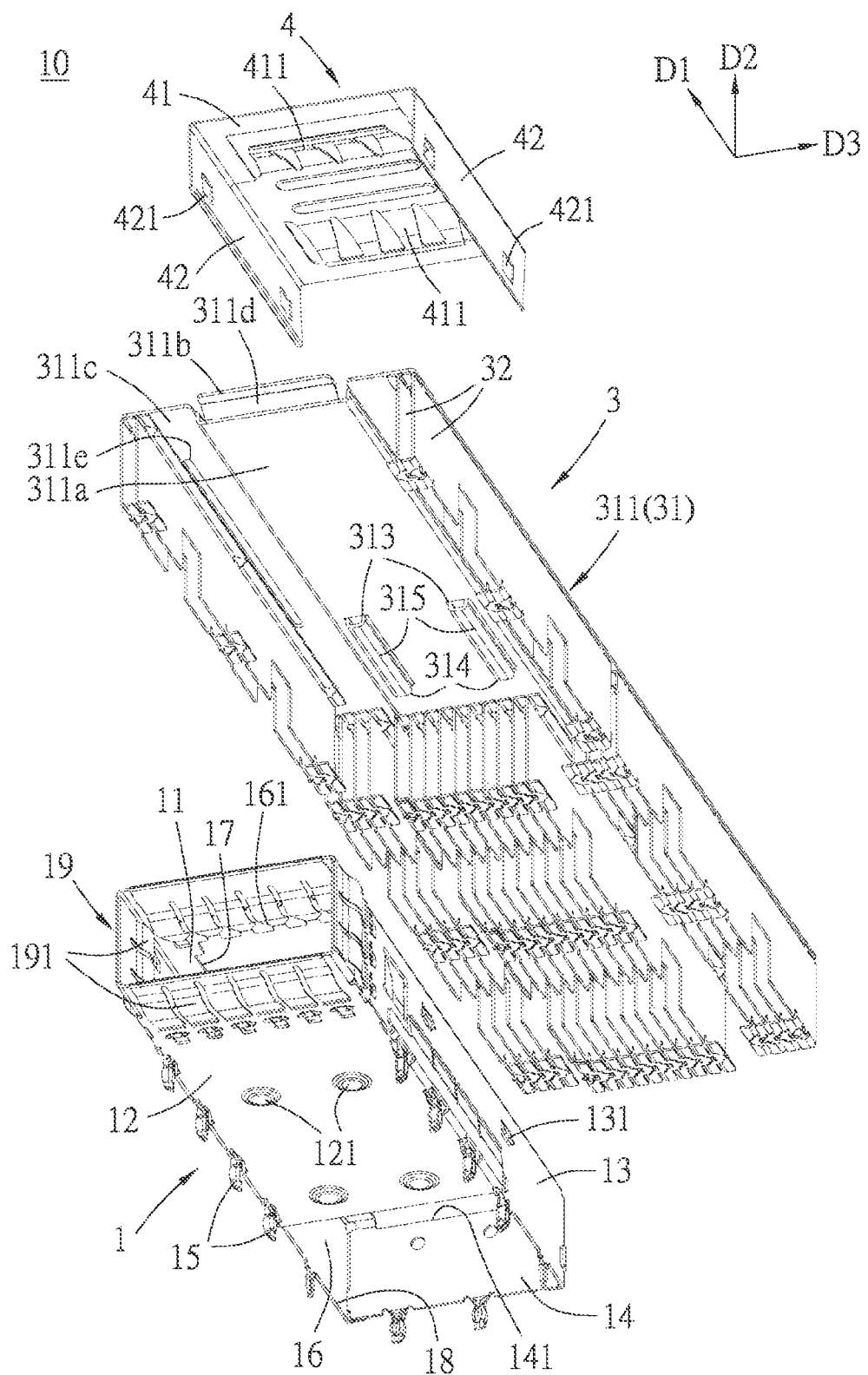
FIG. 3 is an exploded perspective view of FIG. 2 from a different angle.
Figure 4:
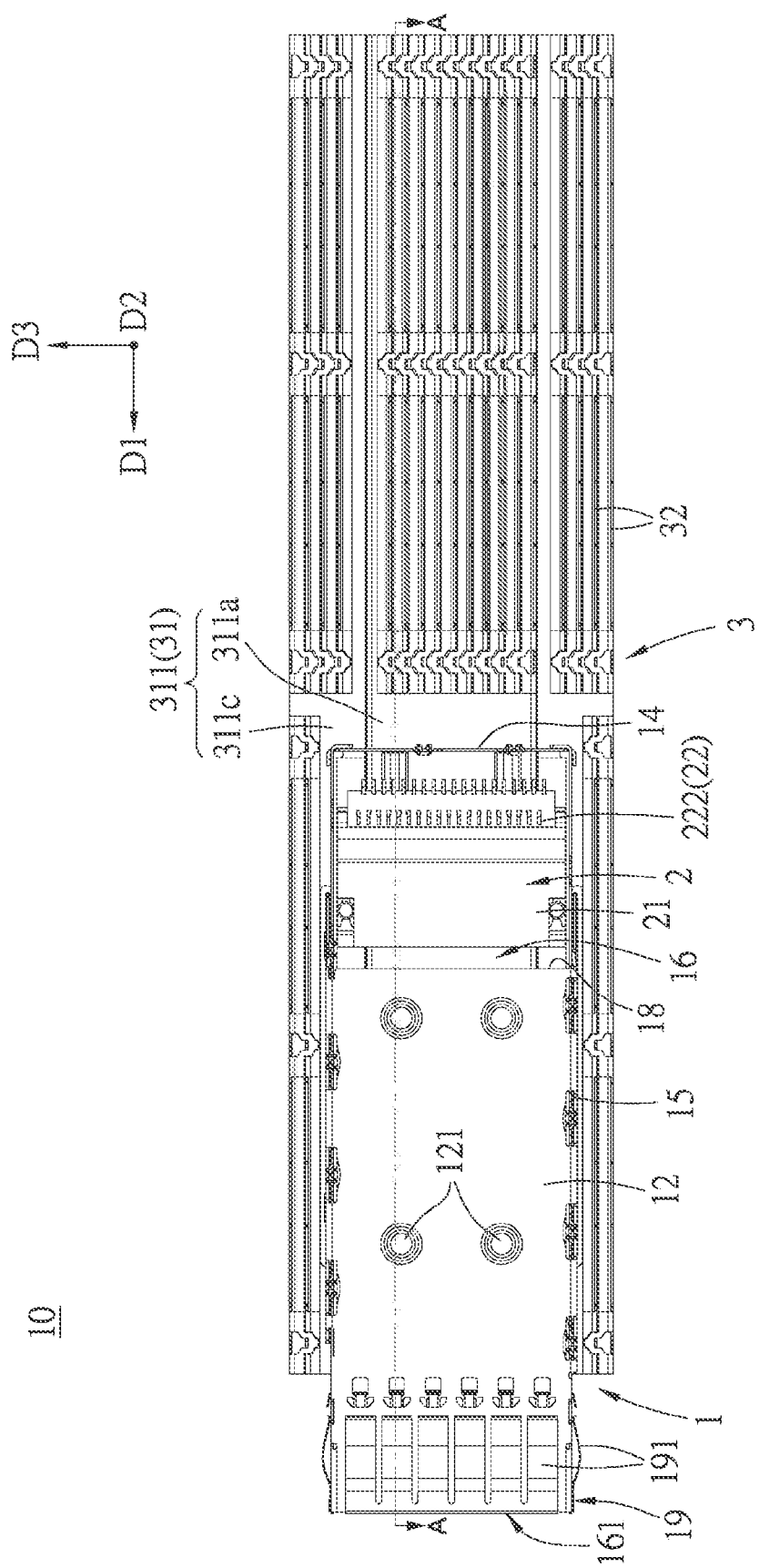
FIG. 4 is a bottom view of the first embodiment.
Figure 5:
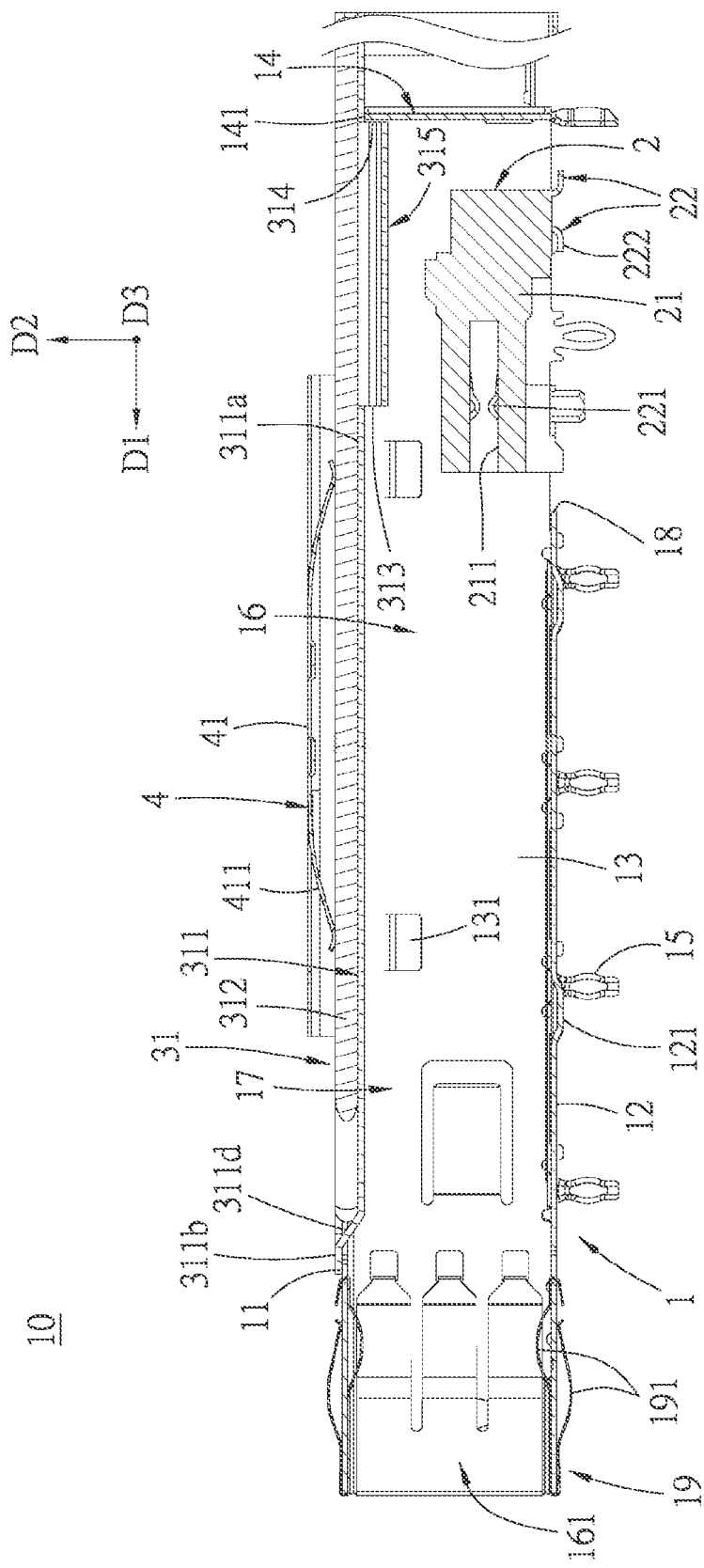
FIG. 5 is an incomplete cross sectional view taken along an A-A line of FIG. 4.
Figure 6:
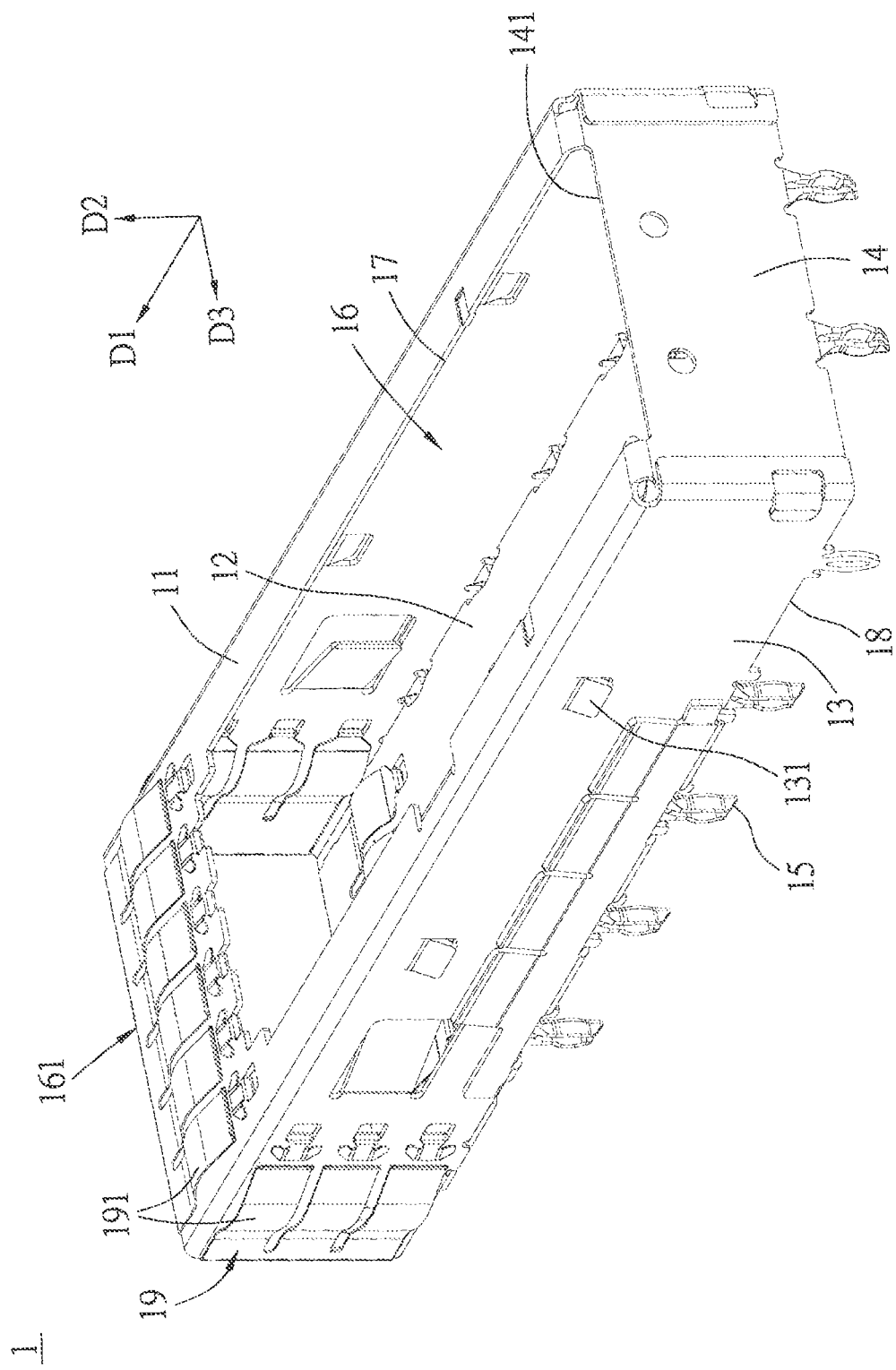
FIG. 6 is a perspective view of a shielding shell of the first embodiment.
Figure 7:
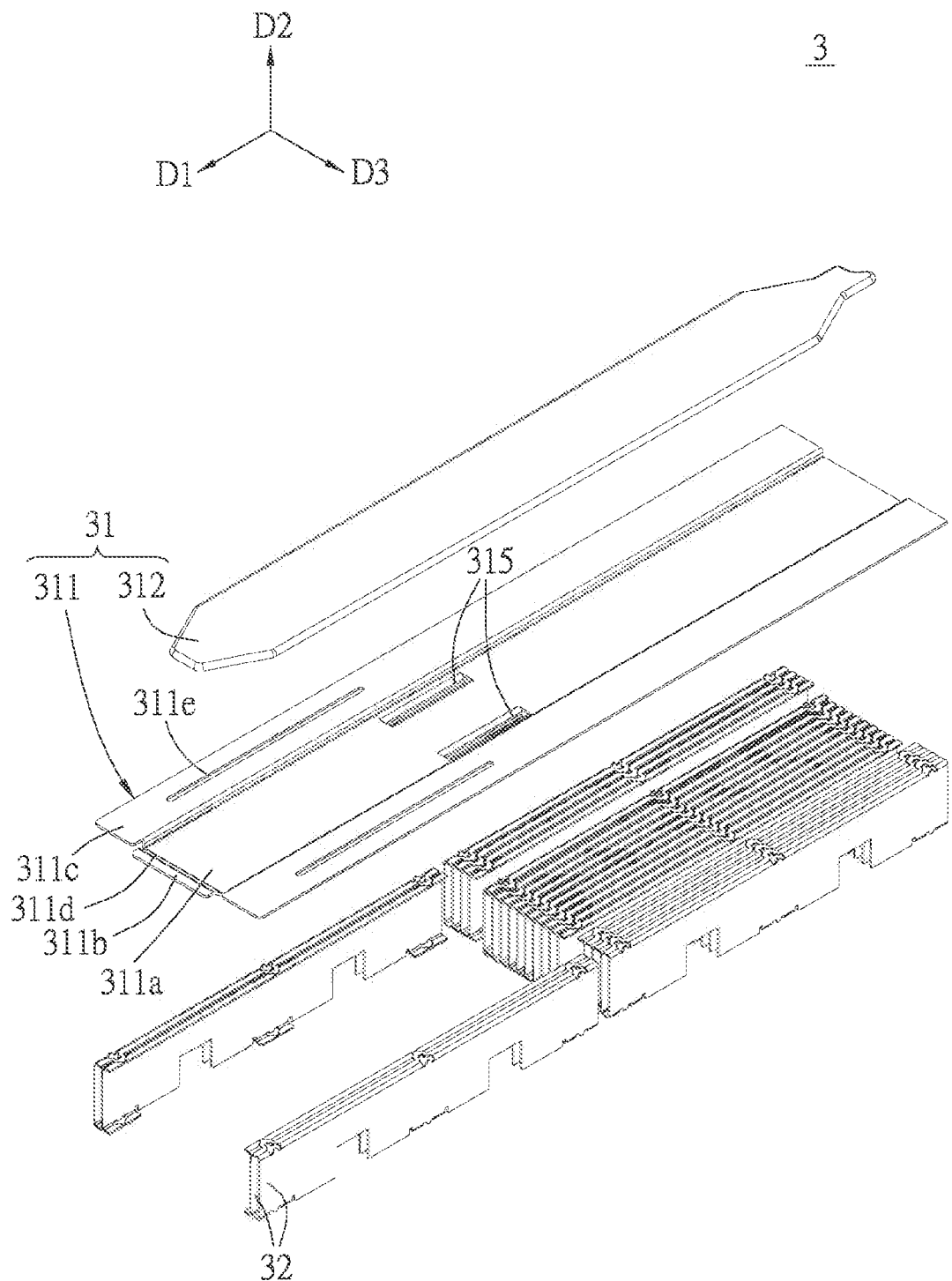
FIG. 7 is an exploded perspective view of a heat sink of the first embodiment.
Figure 8:
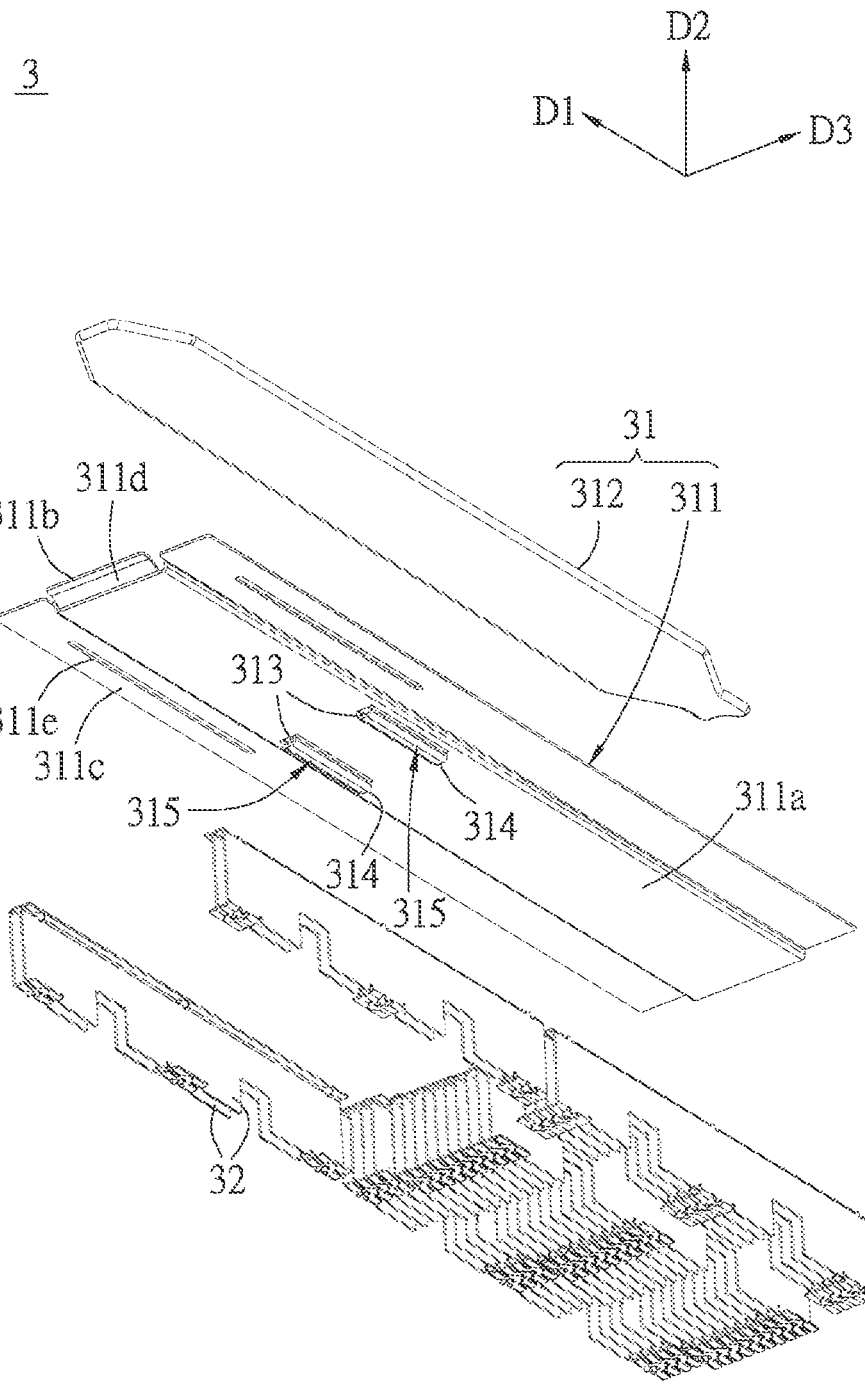
FIG. 8 is an exploded perspective view of FIG. 7 from a different angle.
Figure 9:
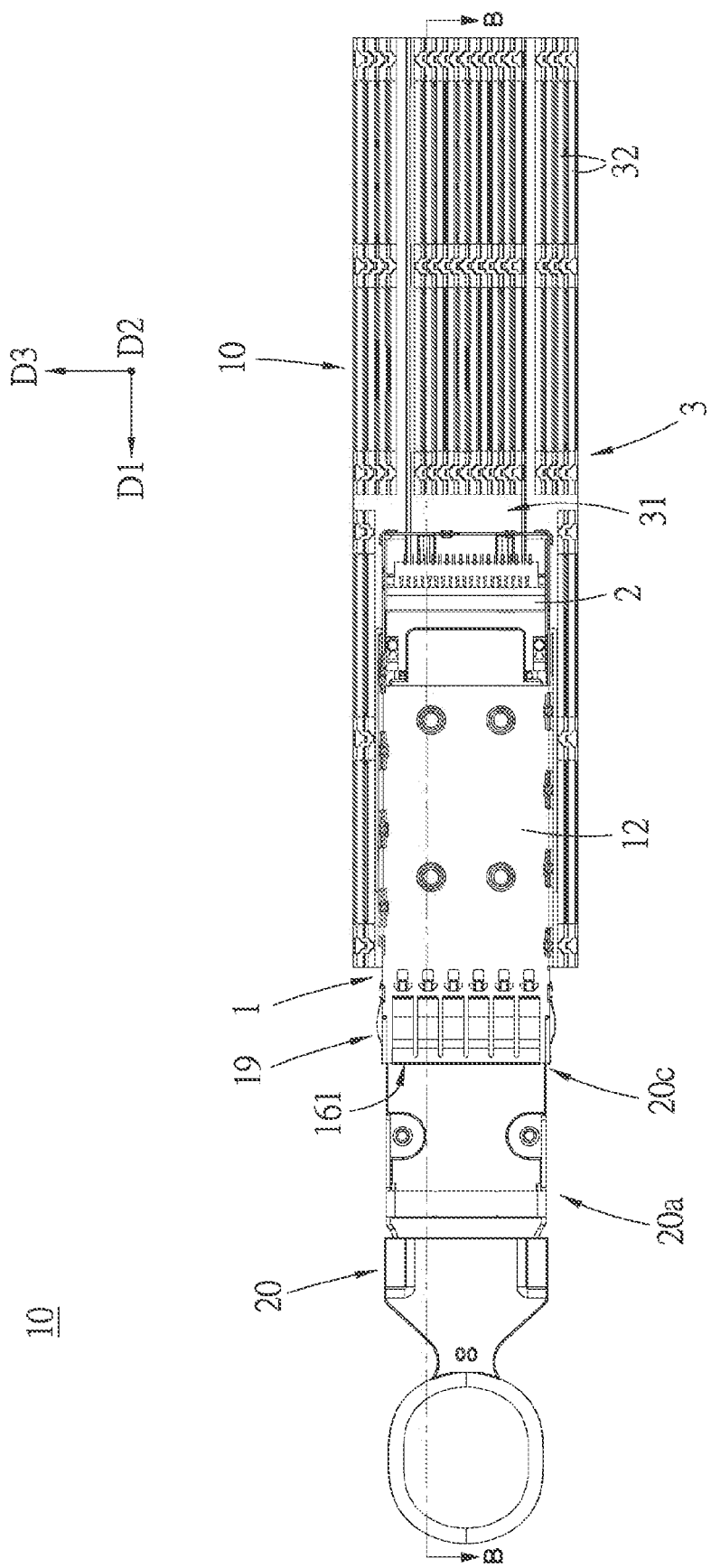
FIG. 9 is a bottom view illustrating the mating module mated with the first embodiment.
Figure 10:
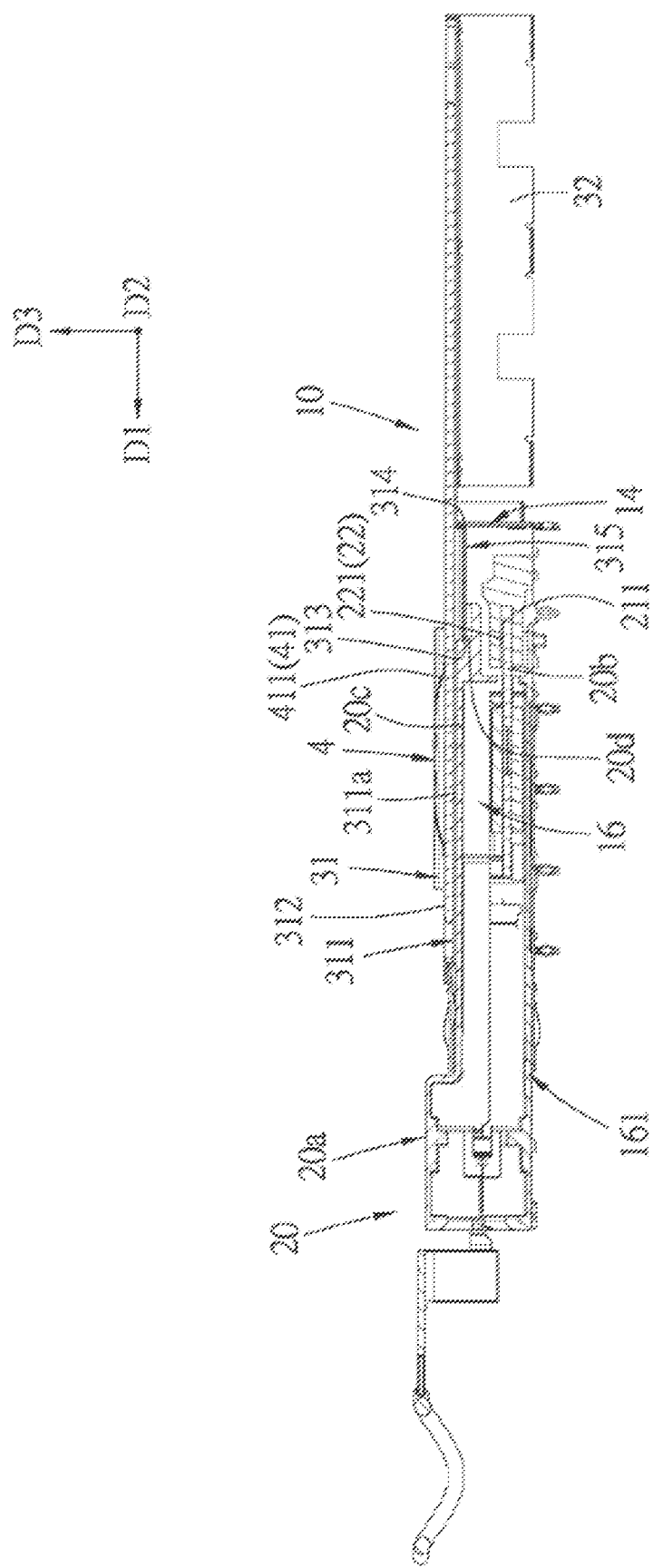
FIG. 10 is a cross sectional view of taken along a B-B line of FIG. 9.
Figure 11:
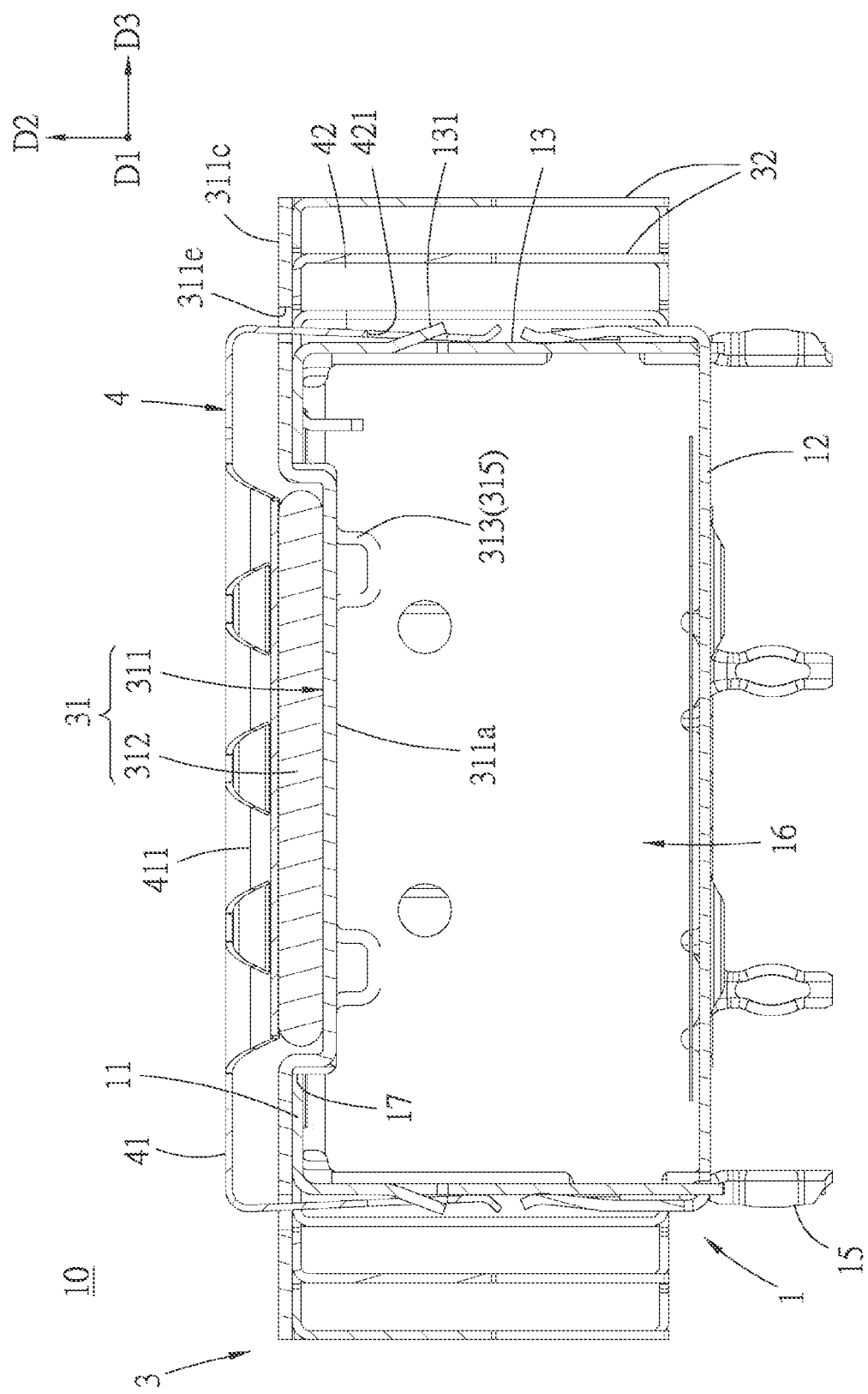
FIG. 11 is a cross sectional view illustrating a clip of the first embodiment presses against a heat pipe of the heat sink, in which the receptacle connector of the first embodiment is omitted.

Referring to FIG. 1, FIG. 2 and FIG. 11, each side wing portion 311c of the base plate 311 of the heat sink 3 is formed with a slit 311e which extends along the front-rear direction D1, the clip 4 is used to mount the heat sink 3 to the shielding shell 1. The clip 4 has a pressing plate 41 which presses against the heat dissipating base 31 of the heat sink 3 and two latching plates 42 which extend downwardly from two sides of the pressing plate 41 respectively, the two latching plates 42 pass through the slits 311e of the two side wing portions 311c respectively so as to latch with the two side walls 13 of the shielding shell 1 respectively; that the slit 311e limits the latching plate 42 in position also may limit a position of the heat dissipating base 31 of the heat sink 3 in the front-rear direction D1. The pressing plate 41 has two elastic pressing portions 411 which each are in the form of a spring plate and which are used to press against the heat dissipating base 31, the two elastic pressing portions 411 also may be other configuration besides the spring plate as long as the other configuration can press against the heat dissipating base 31, so the present disclosure is not limited to the embodiment. Each side wall 13 of the shielding shell 1 is formed with a plurality of latching tabs 131 protruding outwardly, each latching plate 42 is further formed with a plurality of latching holes 421 which correspondingly latch with the latching tabs 131, therefore the clip 4 can latch with the shielding shell 1, makes the heat sink 3 elastically downwardly pressed against by the elastic pressing portions 411 of the clip 4 and assembled to the shielding shell 1, and makes the front wing portion 311b and the two side wing portions 311c of the base plate 311 of the heat sink 3 abut against the top wall 11 respectively at a front side and left and right sides of the window 17. And, in the embodiment, the elastic pressing portions 411 of the clip 4 directly press against (that is, contact) the heat pipe 312 of the heat dissipating base 31, as shown in FIG. 11, heat of the shielding shell 1 can be transferred to the heat pipe 312 of the heat dissipating base 31 via the clip 4 latching with the shielding shell 1 so as to strengthen heat dissipating efficiency.

Figure 12:
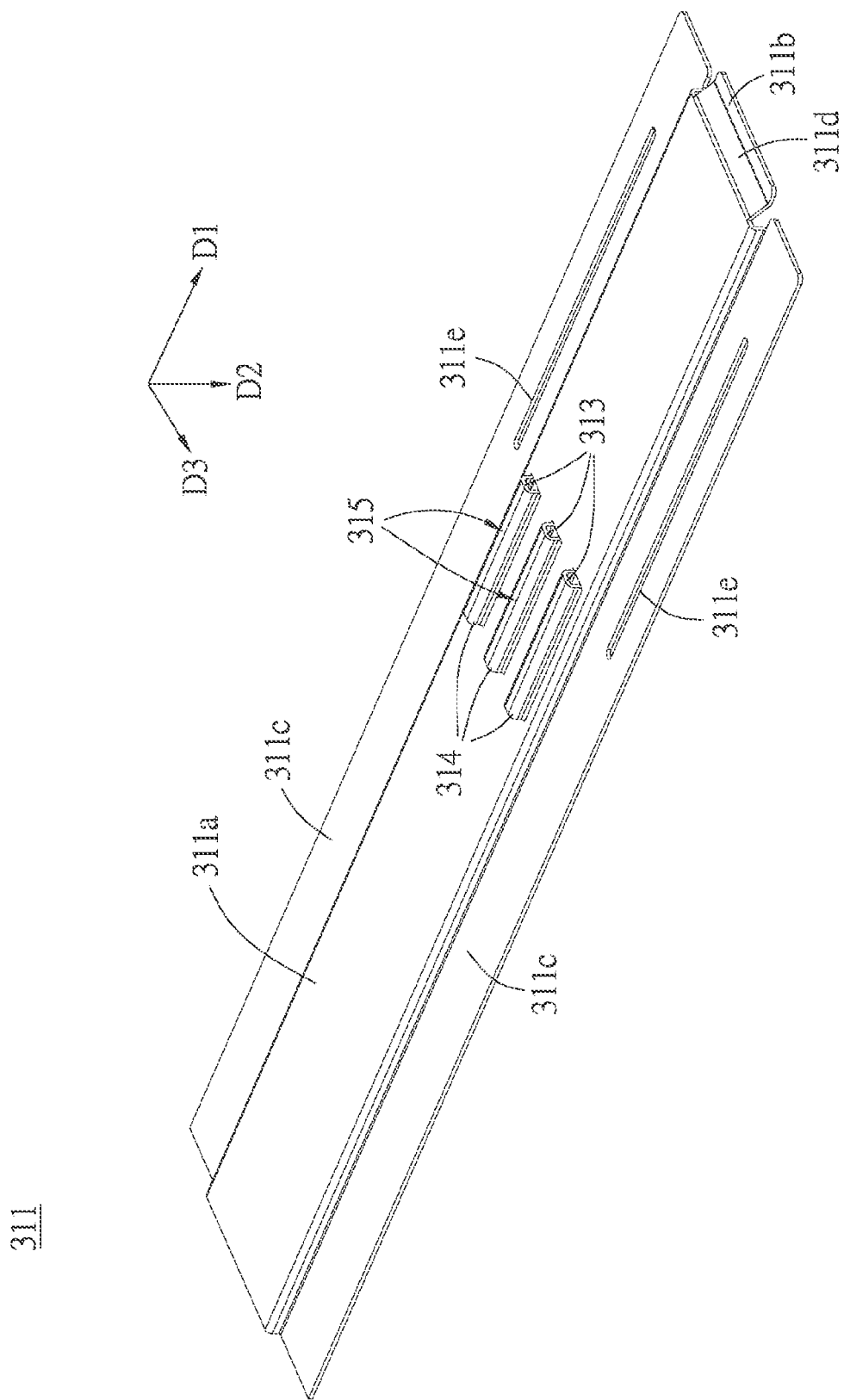
FIG. 12 is a perspective view of a base plate of a heat sink of a second embodiment of the connector assembly of the present disclosure viewed from bottom.

Referring to FIG. 12, a second embodiment of the connector assembly of the present disclosure differs from the first embodiment in that, the bottom face of the bottom plate portion 311a of the heat dissipating base plate 311 is provided with three protruding bars 315 which each extend in the front-rear direction D1 and which are arranged sided by side with each other, furthermore, the number of the protruding bar 315 may be any number, and may be not limited thereto.

Figure 13:
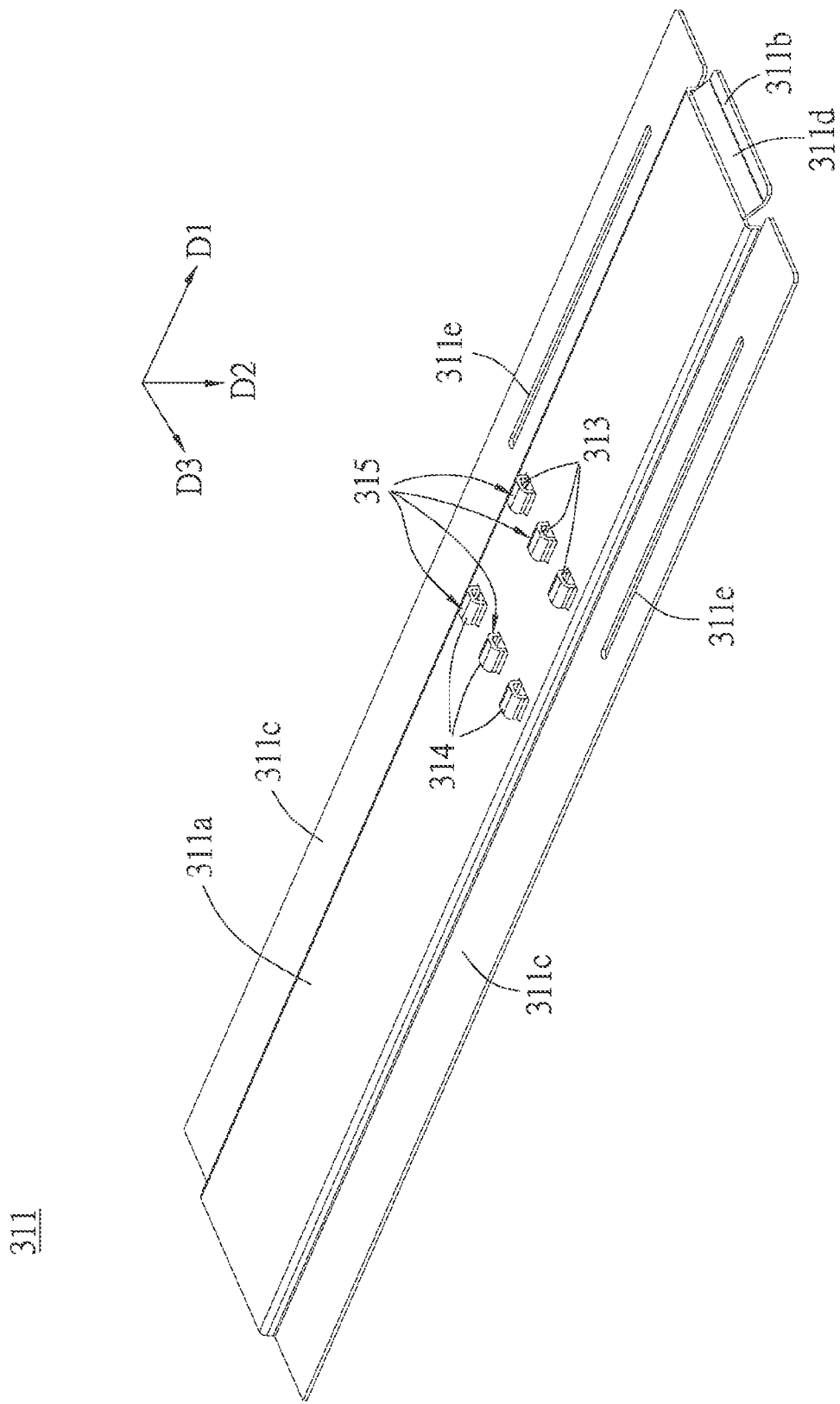
FIG. 13 is a perspective view of a base plate of a heat sink of a third embodiment of the connector assembly of the present disclosure viewed from bottom.

Referring to FIG. 13, a third embodiment of the connector assembly of the present disclosure differs from the second embodiment in that, the bottom face of the bottom plate portion 311a of the heat dissipating base plate 311 is provided with six protruding bars 315 which each extend in the front-rear direction D1, three of the six protruding bars 315 are arranged side by side with each other and positioned in the front, the other three of the six protruding bars 315 are arranged side by side with each other and positioned in the rear. Front ends of the three protruding bars 315 of the six protruding bars 315 positioned in the front constitutes the front stopping portion 313, rear ends of the three protruding bars 315 of the six protruding bars 315 positioned in the rear constitutes the rear stopping portion 314.

Figure 14:
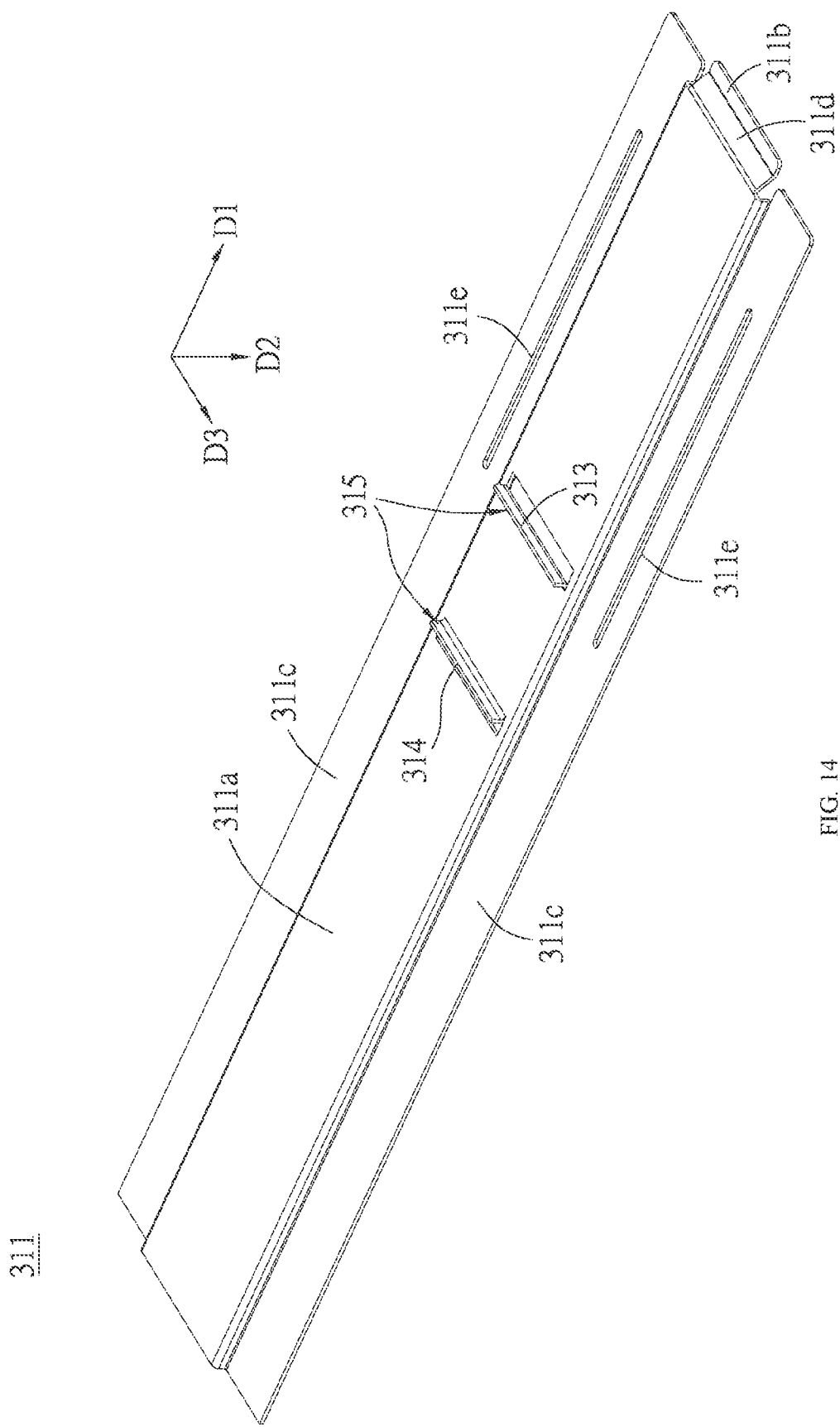
FIG. 14 is a perspective view of a base plate of a heat sink of a fourth embodiment of the connector assembly of the present disclosure viewed from bottom.

Referring to FIG. 14, a fourth embodiment of the connector assembly of the present disclosure differs from the first embodiment in that, the bottom face of the bottom plate portion 311a of the heat dissipating base plate 311 is provided with two protruding bars 315 which each extend laterally in the left-right direction D3 and which are arranged side by side with each other, one of the two protruding bars 315 is positioned in the front, the other of the two protruding bars 315 is positioned in the rear, and the two protruding bars 315 each are formed by first forming a slit having general U-shape and then bending a region of the plate metal surrounded by the slit downwardly. The protruding bar 315 of the two protruding bars 315 positioned in the front constitutes the front stopping portion 313, the protruding bar 315 of the two protruding bars 315 positioned in the rear constitutes the rear stopping portion 314.

Figure 15:
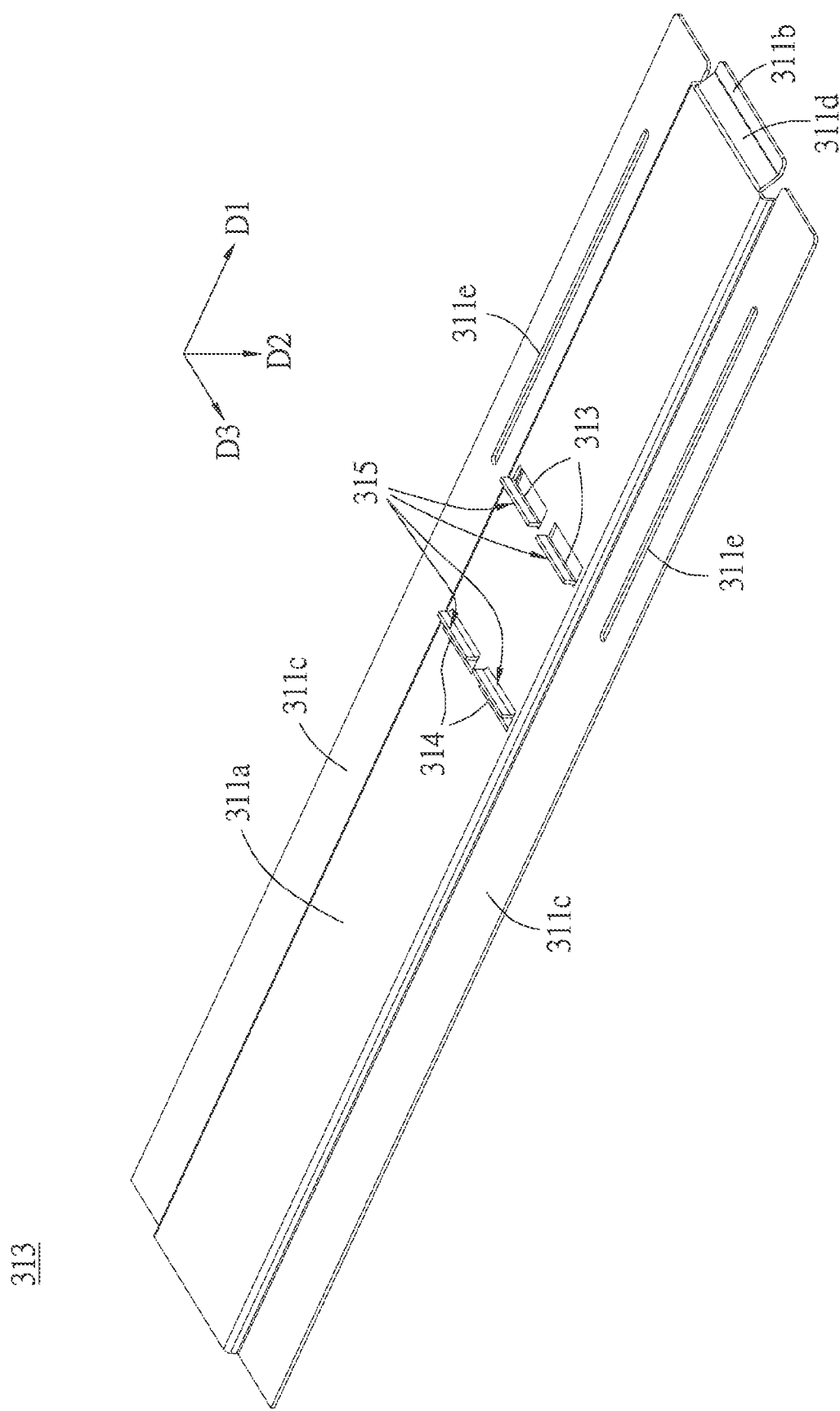
FIG. 15 is a perspective view of a base plate of a heat sink of a fifth embodiment of the connector assembly of the present disclosure viewed from bottom.

Referring to FIG. 15, a fifth embodiment of the connector assembly of the present disclosure differs from the fourth embodiment in that, the bottom face of the bottom plate portion 311a of the heat dissipating base plate 311 is provided with four protruding bars 315 which each extend laterally in the left-right direction D3, two of the four protruding bars 315 are positioned in the front, the other two of the four protruding bars 315 are positioned in the rear. The two protruding bars 315 of the four protruding bars 315 positioned in the front constitutes the front stopping portion 313, the two protruding bars 315 of the four protruding bars 315 positioned in the rear constitutes the rear stopping portion 314.

Figure 16:
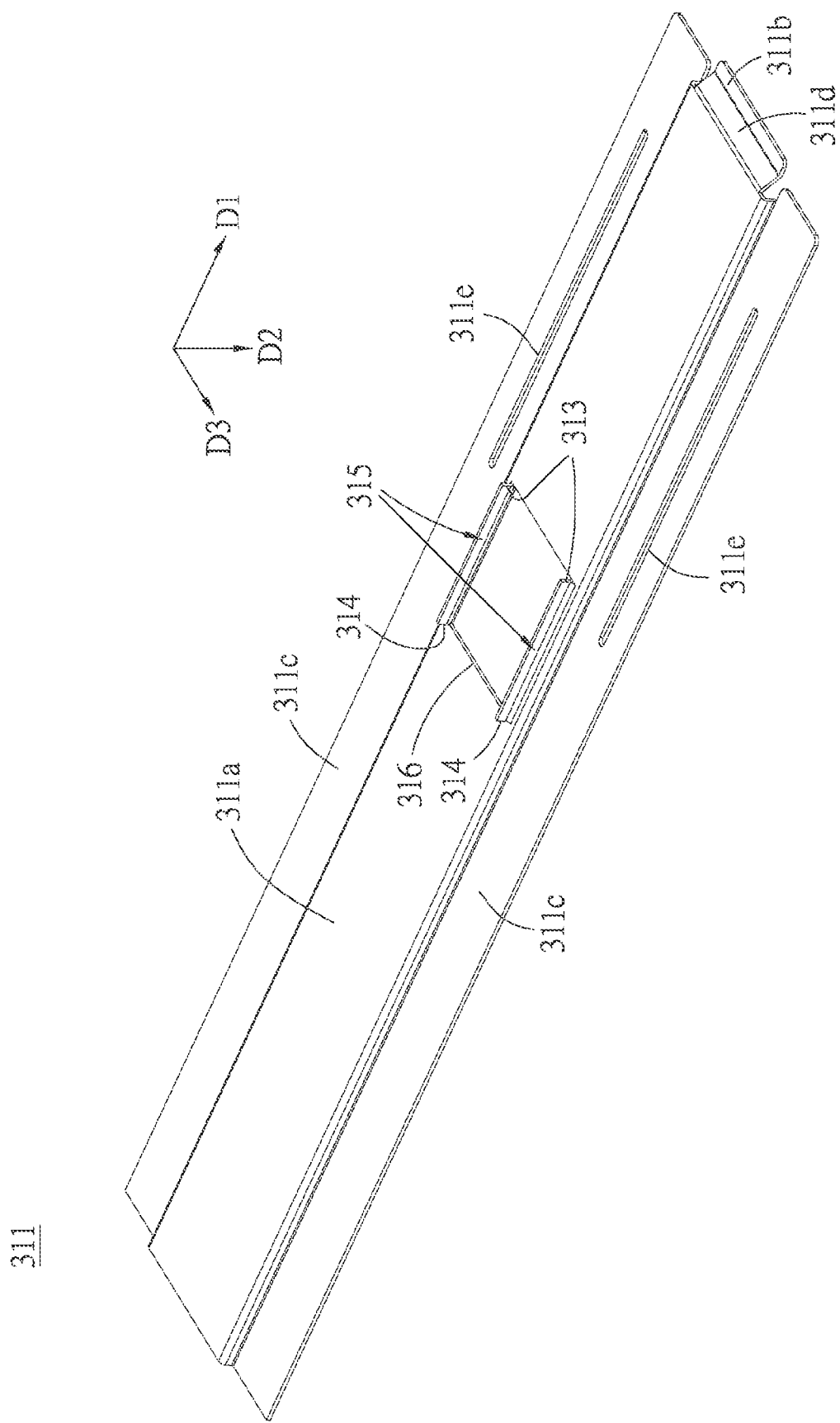
FIG. 16 is a perspective view of a base plate of a heat sink of a sixth embodiment of the connector assembly of the present disclosure viewed from bottom.

Referring to FIG. 16, a sixth embodiment of the connector assembly of the present disclosure differs from the first embodiment in that, when the two protruding bars 315 are formed, a rectangular opening 316 is firstly formed in the bottom plate portion 311a, a front edge and a rear edge of the rectangular opening 316 extend a distance toward two sides along the left-right direction D3 respectively to form slits, each part of the plate metal positioned at each of the two sides of the rectangular opening 316 and surrounded by the corresponding slits is bent downwardly, so as to form the two protruding bars 315 which each extend in the front-rear direction D1 and which are arranged side by side with each other and protrude downwardly.

Figure 17:
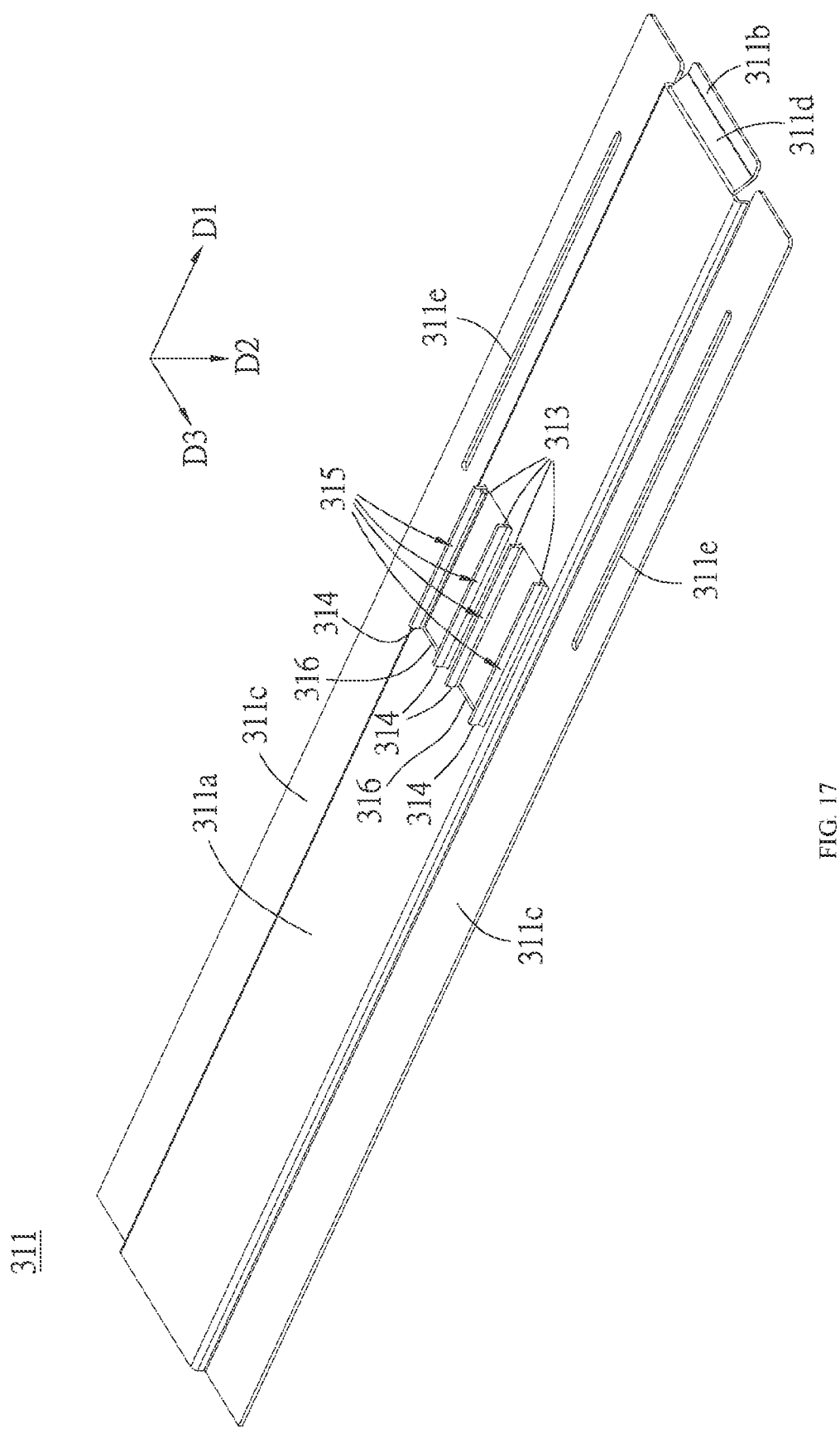
FIG. 17 is a perspective view of a base plate of a heat sink of a seventh embodiment of the connector assembly of the present disclosure viewed from bottom.

Referring to FIG. 17, a seventh embodiment of the connector assembly of the present disclosure differs from the sixth embodiment in that, the bottom plate portion 311a is formed with two rectangular openings 316 which each extend along the front-rear direction D1 and which are arranged side by side with each other, and sides of the two rectangular openings 316 are totally formed with four protruding bars 315 which each extend in the front-rear direction D1 and which are arranged side by side with each other and protrude downwardly.

Figure 18:
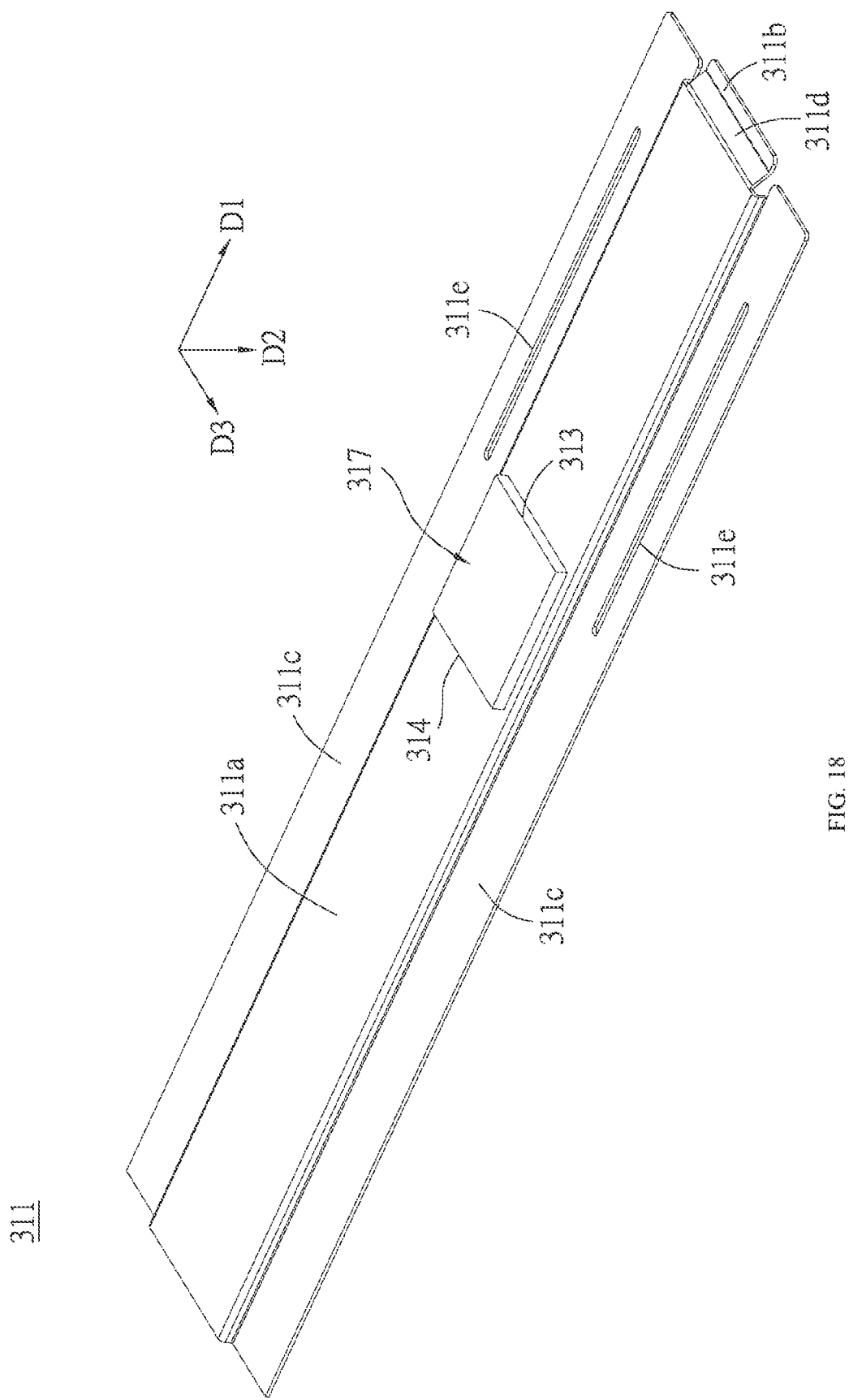
FIG. 18 is a perspective view of a base plate of a heat sink of an eighth embodiment of the connector assembly of the present disclosure viewed from bottom.

Referring to FIG. 18, an eighth embodiment of the connector assembly of the present disclosure differs from the first embodiment in that, the bottom face of the bottom plate portion 311a of the heat dissipating base plate 311 is provided with a protruding block 317 which protrudes downwardly and has a rectangular shape, a front side of the protruding block 317 constitutes the front stopping portion 313, a rear side of the protruding block 317 constitutes the rear stopping portion 314. In the eighth embodiment, the protruding block 317 is formed by downwardly stamping a plate metal so as to make a portion of the plate metal protrude; but in other embodiments, the protruding block 317 also may be provided to the bottom face of the bottom plate portion 311a by welding, but the present disclosure is not limited thereto.

Figure 19:
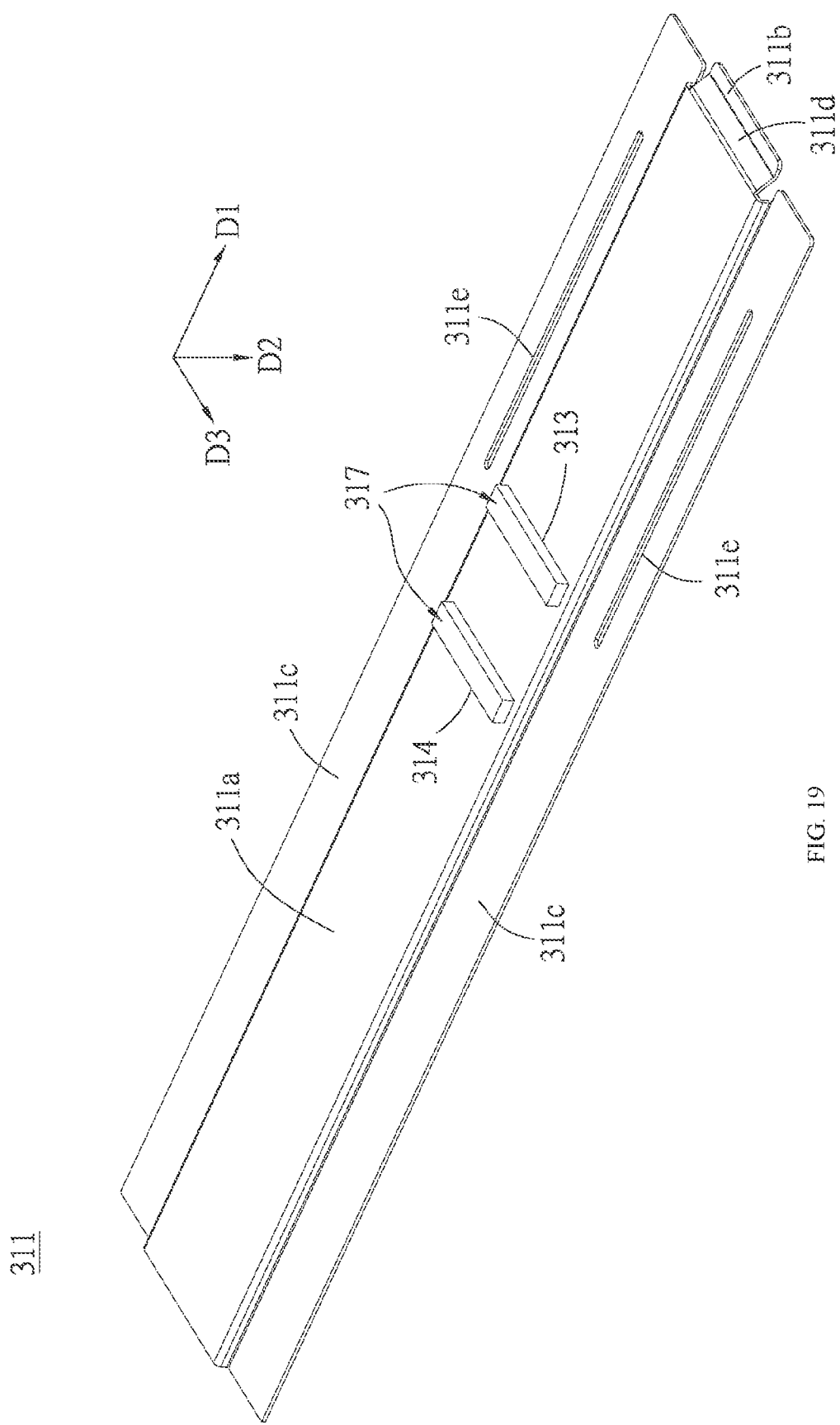
FIG. 19 is a perspective view of a base plate of a heat sink of a ninth embodiment of the connector assembly of the present disclosure viewed from bottom.

Referring to FIG. 19, a ninth embodiment of the connector assembly of the present disclosure differs from the eighth embodiment in that, the bottom face of the bottom plate portion 311a of the heat dissipating base plate 311 is provided with two protruding blocks 317 which protrude downwardly and each have a rectangular shape, the two protruding blocks 317 each laterally extend in the left-right direction D3 and the two protruding blocks 317 are arranged side by side with each other, one of the two protruding bars 315 is positioned in the front, the other of the two protruding bars 315 is positioned in the rear, a front side of the protruding block 317 of the two protruding blocks 317 positioned in the front constitutes the front stopping portion 313, a rear side of the protruding block 317 of the two protruding blocks 317 positioned in the rear constitutes the rear stopping portion 314.

Figure 20:
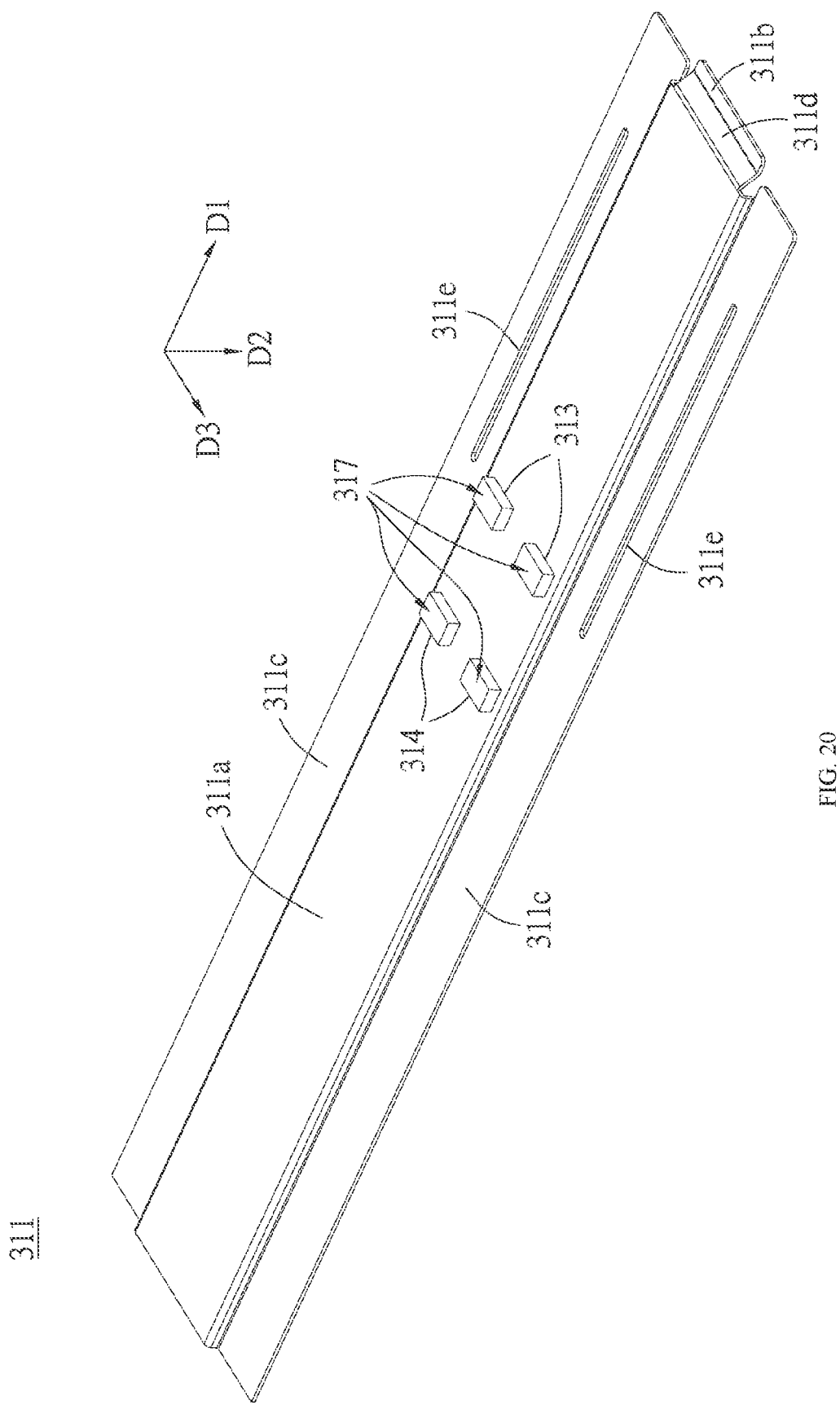
FIG. 20 is a perspective view of a base plate of a heat sink of a tenth embodiment of the connector assembly of the present disclosure viewed from bottom.

Referring to FIG. 20, a tenth embodiment of the connector assembly of the present disclosure differs from the ninth embodiment in that, the bottom face of the bottom plate portion 311a of the heat dissipating base plate 311 is provided with four protruding blocks 317 which protrude downwardly and each have a rectangular shape, the four protruding blocks 317 each laterally extend in the left-right direction D3, two of the four protruding blocks 317 are positioned in the front, the other two of the four protruding blocks 317 are positioned in the rear front sides of the two protruding blocks 317 of the four protruding blocks 317 positioned in the front constitutes the front stopping portion 313, rear sides of the two protruding blocks 317 of the four protruding blocks 317 positioned in the rear constitutes the rear stopping portion 314.

In conclusion, in the connector assembly 10 of the present disclosure, by that the window 17 of the shielding shell 1 extends rearwardly to expose the top face of the receptacle connector 2, the heat sink 3 can directly face the receptacle connector 2 at a lower position without any spacer via the window 17, and the bottom face of the heat sink 3 or the heat pipe 312 can straightly extend rearwardly, thereby improving heat dissipating efficiency. And by that the front stopping portion 313 used to stop the mating module 20 and the rear stopping portion 314 used to be limited in position by the rear wall 14 in a direction toward the rear are provided to the bottom face of the heat dissipating base 31, the heat sink 3 further enters into the receiving cavity 16 by means of the front stopping portion 313 and the rear stopping portion 314, and the heat sink 3 can be closer to the receptacle connector 2, so as to further strengthen heat dissipating efficiency. And the front stopping portion 313 can move upwardly with the heat sink 3, which can optimize the whole configuration and has more limiting function in position.

However, the above description is only for the embodiments of the present disclosure, and it is not intended to limit the implementing scope of the present disclosure, and the simple equivalent changes and modifications made according to the claims and the contents of the specification are still included in the scope of the present disclosure.

What is claimed is:

1. A connector assembly, comprising:
a shielding shell having a top wall, a receiving cavity positioned inside the shielding shell, an inserting opening which is positioned at a front end of the shielding shell and is in communication with the receiving cavity and a window which is formed in the top wall, the window extending rearwardly and being in communication with the receiving cavity;
a receptacle connector positioned in a rear segment of the receiving cavity, the window of the shielding shell extending rearwardly to expose a top face of the receptacle connector; and
a heat sink provided to the top wall, the heat sink comprising a heat dissipating base, a bottom face of the heat dissipating base downwardly entering into the receiving cavity via the window and directly facing the top face of the receptacle connector, a position of the bottom face of the heat dissipating base facing the receptacle connector being provided with a front stopping portion which protrudes downwardly and is configured to stop a mating module.

2. The connector assembly of claim 1, wherein the shielding shell further has a rear wall positioned at a rear end of the shielding shell, a position of the bottom face of the heat dissipating base facing the rear wall is provided with a rear stopping portion which protrudes downwardly, the rear stopping portion is limited by the rear wall in a direction toward the rear.

3. The connector assembly of claim 2, wherein the shielding shell window extends rearwardly and passes through the rear wall to form a notch at an upper edge of the rear wall, the bottom face of the heat dissipating base extends rearwardly and extends out from the notch of the rear wall by a distance.

4. The connector assembly of claim 3, wherein the heat dissipating base comprises a base plate, the base plate has a bottom plate portion which is recessed downwardly and enters into the window.

5. The connector assembly of claim 4, wherein the base plate further has a front wing portion and two side wing portions, the front wing portion and the two side wing portions are connected to the bottom plate portion and provided to a top face of the top wall.

6. The connector assembly of claim 5, wherein
each side wing portion of the base plate of the heat sink is formed with a slit,
the connector assembly further comprises a clip used to mount the heat sink to the shielding shell, the clip has a pressing plate which presses against the heat sink and two latching plates which extend downwardly from two sides of the pressing plate respectively, the two latching plates pass through the slits of the two side wing portions respectively to latch with the shielding shell.

7. The connector assembly of claim 4, wherein the bottom face of the bottom plate portion is provided with protruding bars which extend in a front-rear direction and protrude downwardly, front ends of the protruding bars together form the front stopping portion, rear ends of the protruding bars together form the rear stopping portion.

8. The connector assembly of claim 4, wherein the bottom face of the bottom plate portion is provided with a plurality of protruding bars which each extend laterally and protrude downwardly, a part of the plurality of protruding bars positioned in the front forms the front stopping portion, a part of the plurality of protruding bars positioned in the rear forms the rear stopping portion.

9. The connector assembly of claim 4, wherein the bottom face of the bottom plate portion is provided with a protruding block which protrudes downwardly, a front side of the protruding block forms the front stopping portion, a rear side of the protruding block forms the rear stopping portion.

10. A connector assembly, comprising:
a shielding shell having a top wall, a receiving cavity positioned inside the shielding shell, an inserting opening which is positioned at a front end of the shielding shell and in communication with the receiving cavity and a window which is formed in the top wall and is in communication with the receiving cavity, the window extending rearwardly and passing through a rear end of the shielding shell;
a receptacle connector positioned in a rear segment of the receiving cavity; and
a heat sink provided to the top wall, the heat sink comprising a heat dissipating base, the heat dissipating base comprising a heat pipe, a bottom face of the heat dissipating base downwardly entering into the receiving cavity via the window and directly facing a top face of the receptacle connector, the bottom face of the heat dissipating base and the heat pipe extending rearwardly out from the rear end of the shielding shell by a distance.

11. The connector assembly of claim 10, wherein
the heat dissipating base further comprises a base plate, the base plate has a bottom plate portion which is recessed downwardly and enters the window,
the heat pipe is provided to a top face of the bottom plate portion,
the bottom plate portion and the heat pipe extend rearwardly out from the rear end of the shielding shell by a distance, and
the heat sink further comprises a heat dissipating fin provided to the base plate of the heat dissipating base.

12. The connector assembly of claim 11, wherein a position of the bottom face of the bottom plate portion facing the receptacle connector is provided with a front stopping portion which protrudes downwardly and is configured to stop a mating module.

13. The connector assembly of claim 12, wherein
the shielding shell further includes a rear wall positioned at a rear end of the shielding shell,
the window of the shielding shell extends rearwardly and passes through the rear wall to form a notch at an upper edge of the rear wall,
the bottom plate portion extends rearwardly and extends out from the notch of the rear wall by a distance, and
a position of the bottom face of the bottom plate portion facing the rear wall is provided with a rear stopping portion which protrudes downwardly, the rear stopping portion is limited by the rear wall in a direction toward the rear.

14. The connector assembly of claim 13, wherein the base plate further has a front wing portion and two side wing portions, the front wing portion and the two side wing portions are connected to the bottom plate portion and provided to a top face of the top wall.

15. The connector assembly of claim 14,
   each side wing portion of the base plate of the heat sink is formed with a slit,
   the connector assembly further comprises a clip used to mount the heat sink to the shielding shell, the clip has a pressing plate which presses against the heat sink and two latching plates which extend downwardly from two sides of the pressing plate respectively, the two latching plates pass through the slits of the two side wing portions respectively to latch with the shielding shell.

16. The connector assembly of claim 13, wherein the bottom face of the bottom plate portion is provided with protruding bars which extend in a front-rear direction and protrude downwardly, front ends of the protruding bars together form the front stopping portion, rear ends of the protruding bars together form the rear stopping portion.

17. The connector assembly of claim 13, wherein the bottom face of the bottom plate portion is provided with a plurality of protruding bars which each extend laterally and protrude downwardly, a part of the plurality of protruding bars positioned in the front is used to form the front stopping portion, a part of the plurality of protruding bars positioned in the rear is used to form the rear stopping portion.

18. The connector assembly of claim 13, wherein the bottom face of the bottom plate portion is provided with a protruding block which protrudes downwardly, a front side of the protruding block forms the front stopping portion, a rear side of the protruding block forms the rear stopping portion.

* * * * *